(12) United States Patent
Chunder et al.

(10) Patent No.: US 10,118,989 B2
(45) Date of Patent: Nov. 6, 2018

(54) METHODS OF FORMING BLOCK POLYMERS FOR DIRECTED SELF-ASSEMBLY

(71) Applicant: International Business Machines Corporation, Armonk, NY (US)

(72) Inventors: Anindarupa Chunder, San Jose, CA (US); Daniel P. Sanders, San Jose, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 15/397,391

(22) Filed: Jan. 3, 2017

(65) Prior Publication Data

US 2017/0114183 A1  Apr. 27, 2017

Related U.S. Application Data

(62) Division of application No. 14/280,167, filed on May 16, 2014, now Pat. No. 9,562,127.

(51) Int. Cl.
    *C08G 64/18* (2006.01)
    *C08G 64/30* (2006.01)
    *C08G 64/20* (2006.01)

(52) U.S. Cl.
    CPC ............. *C08G 64/18* (2013.01); *C08G 64/30* (2013.01)

(58) Field of Classification Search
    CPC ........................................................ C08G 64/18
    USPC ............................... 528/327.7, 330.1, 333.3
    See application file for complete search history.

(56) References Cited

U.S. PATENT DOCUMENTS

| | | |
|---|---|---|
| 4,080,491 A | 3/1978 | Kobayashi et al. |
| 7,129,314 B2 | 10/2006 | Miyata et al. |
| 8,507,640 B2 | 8/2013 | Coady et al. |
| 2006/0235161 A1 | 10/2006 | Heller et al. |
| 2011/0224373 A1 | 9/2011 | Carpentier et al. |
| 2013/0017189 A1 | 1/2013 | Pierre et al. |

OTHER PUBLICATIONS

Koulic, et al., "Premade versus in situ formed compatibilizer at the PS/PMMA interface: contribution of the Raman confocal microscopy to the fracture analysis", Polymer 42 (2001) 2947-2957.

Vora, et al., "Organic High-Chi Block Copolymers for Directed Self-Assembly", Poster, SPIE Advanced Lithography Conference, Feb. 25, 2014, San Jose, California.

Zhou, et al., "Synthesis and properties of novel biodegradable triblock copolymers of poly(5-methyl-5-methoxycarbonyl-1,3-dioxan-2-one) and poly(ethylene glycol)", Polymer 45 (2004) 5459-5463.

*Primary Examiner* — Duc Truong
(74) *Attorney, Agent, or Firm* — Michael R. Roberts

(57) ABSTRACT

Block polymers are formed by ring opening polymerization (ROP) of a cyclic carbonate monomer using a polymeric initiator for the ROP that comprises repeating functionalized ethylene units. The block polymers are free of, or substantially free of, any polymer having a chemical structure that does not comprise the polymer backbone of the polymeric initiator. The block polymers are capable of directed self-assembly.

21 Claims, 22 Drawing Sheets

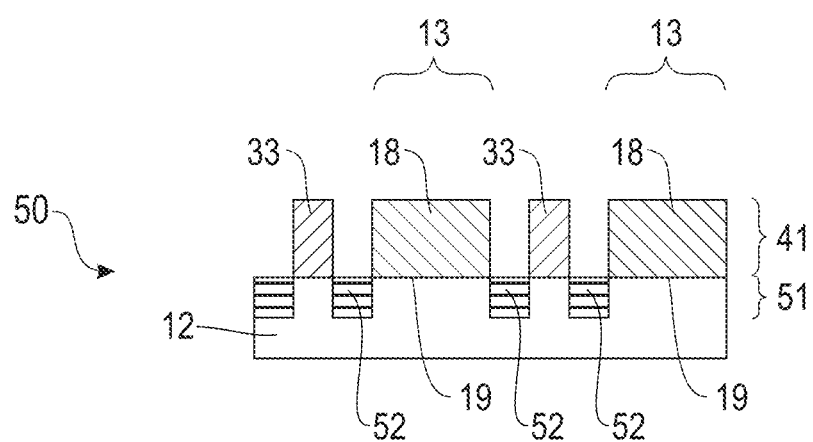

1. coat
2. self-assemble etch transfer

METHODS OF FORMING BLOCK POLYMERS FOR DIRECTED SELF-ASSEMBLY

This application is a DIV of Ser. No. 14/280,167 filed May 16, 2014 now U.S. Pat. No. 9,562,127.

BACKGROUND

The present invention relates to methods of forming block polymers for directed self-assembly applications, more specifically methods of making high-chi ($\chi$) block polymers prepared by ring opening of cyclic carbonyl monomers.

Block copolymers (BCPs) find many applications in solution, bulk and thin films. Thin film applications of BCPs are particularly attractive for nanolithography and patterning due to the ability of some BCPs to form periodic self-assembled structures ranging in feature size from 5 nm to 50 nm. The thin-film self-assembly property of BCPs can be utilized with existing photolithographic techniques to provide a unique approach to long range order for semiconductor applications. This approach, called directed self-assembly (DSA) of block copolymers, promises to extend the patterning capabilities of conventional lithography.

BCPs for directed self-assembly (DSA) applications comprise two or three polymer blocks that can phase separate into ordered nanoscopic arrays of spheres, cylinders, gyroids, and lamellae. The ability of a BCP to phase separate depends on the Flory Huggins interaction parameter ($\chi$). PS-b-PMMA is the most widely used block copolymer for DSA. However, the minimum half-pitch of PS-b-PMMA is limited to about 10 nm because of lower interaction and interaction parameter ($\chi$) between PS and PMMA. To enable further feature miniaturization, a block copolymer with higher interaction parameter between two blocks (higher chi) is highly desirable.

Several block copolymers having higher interaction parameter between the two blocks have been studied to obtain smaller feature sizes. Of particular interest are block copolymers comprising a block derived from ring opening of a cyclic carbonyl monomer from a reactive end-group on the first polymer block. Block copolymers derived by ring opening polymerization (ROP) of cyclic monomers (e.g., lactides, lactams, lactones, ethylene oxide) have been used to generate sub-10 nm feature size for patterning applications.

In the case of ring opening polymerizations (ROP) of cyclic carbonyl monomers, several side reactions can occur. For example, ROP of cyclic ester monomers (i.e., lactides and/or lactones) can include transesterification reactions and/or end group backbiting reactions (Macromolecules, 1998, 31, 2114) that can degrade the polyester backbone, broaden the molecular weight distribution of the block copolymer, and/or form residual free polyester chains and/or cyclic polyester oligomers. Similar side reactions can occur in ring opening polymerization of cyclic carbonates that can significantly broaden the molecular weight distribution and ultimately lead to bimodal GPC traces (Macromolecules, 2011, 44 (7), pp 2084-2091). The presence of moisture or other nucleophilic impurities either in the cyclic carbonyl monomer, reaction solvent, catalyst, and/or the initiator can also form ring opened oligomers or ROP homopolymers in addition to the desired block copolymers (Macromolecules 2010, 43, 8828-8835). Oftentimes the cyclic oligomers or homopolymers formed as side reactions cannot be easily separated from the block copolymers, resulting in poor thin-film self-assembly behavior. For good thin-film self-assembly, block copolymers that are free of homopolymer and that have low polydispersity index (PDI) are preferred.

Thus, there exists a need for methods of forming ROP based block copolymers for self-assembly applications that minimize the amount of homopolymer, cyclic oligomer and other byproducts derived from ring opening of cyclic carbonyl monomer.

SUMMARY

Accordingly, a method is disclosed, comprising:

forming a reaction mixture for a ring opening polymerization (ROP), the reaction mixture comprising a cyclic carbonyl monomer, a polymeric initiator for the ROP, a ROP catalyst, and a solvent, wherein the polymeric initiator comprises i) a polymer backbone comprising repeating functionalized ethylene units and ii) 1 to 2 nucleophilic groups capable of initiating a ROP of the cyclic carbonyl monomer;

allowing the cyclic carbonyl monomer to polymerize by ROP until 85% or more of the cyclic carbonyl monomer is consumed, thereby forming a second mixture comprising an initial block polymer, wherein the initial block polymer comprises a first block linked to a second block, the first block comprising the polymer backbone comprising repeating functionalized ethylene units, the second block comprising a backbone derived from ROP of the cyclic carbonyl monomer;

precipitating the initial block polymer in a solvent mixture comprising i) a first solvent which is a non-solvent for the first block, and ii) a second solvent comprising a nitrile group, wherein the first solvent:second solvent volume ratio is about 40:60 to about 60:40, thereby forming a final block polymer that is free of, or substantially free of, any polymer having a chemical structure that contains none of the polymer backbone of the polymeric initiator.

Another method is disclosed, comprising:
A method, comprising:

i) providing a mathematical function F(t) for a ring opening polymerization (ROP) of a cyclic carbonyl monomer, wherein F(t) expresses an amount of consumed cyclic carbonyl monomer as a function of ROP duration time t for given reaction conditions, the ROP utilizes a reaction mixture initially comprising the cyclic carbonyl monomer, a polymeric initiator for the ROP, a ROP catalyst, and a solvent, the polymeric initiator comprises i) a polymer backbone comprising repeating functionalized ethylene units and ii) 1 to 2 nucleophilic groups linked to respective end groups of the polymer backbone, the nucleophilic groups capable of initiating the ROP of the cyclic carbonyl monomer, F(t) has a duration time $t_1>0$ corresponding to 50% consumption of the cyclic carbonyl monomer, F(t) has duration times $t_2$ and $t_3$ wherein $t_3>t_2>t_1$, F(t) has a first derivative designated F'(t), F'(t) at $t_1$ has a value $F'(t_1)=m$, wherein m is a number >0, F'(t) at $t_2$ has a value $F'(t_2)=0.9m$, and F'(t) at $t_3$ has a value $F'(t_3)=0.8m$;

ii) conducting the ROP of the cyclic carbonyl monomer using the given set of reaction conditions; and iii) stopping the ROP at a ROP duration time of about $t_1$ to about $t_3$, thereby forming a second mixture comprising a final block polymer capable of self-assembly, wherein the final block polymer comprises a first block linked to a second block, the first block comprising the polymer backbone comprising repeating functionalized ethylene units, the second block comprising a backbone derived from ROP of the cyclic carbonyl monomer, and wherein the second mixture is free of, or substantially free of, any polymer having a chemical structure that contains none of the polymer backbone of the polymeric initiator.

Another method is disclosed, comprising:
A method, comprising:
i) providing a mathematical function F(t) for a ring opening polymerization (ROP) of a cyclic carbonyl monomer, wherein
F(t) expresses an amount of consumed cyclic carbonyl monomer as a function of ROP duration time t for given reaction conditions,
the ROP utilizes a reaction mixture initially comprising the cyclic carbonyl monomer, a polymeric initiator for the ROP, a ROP catalyst, and a solvent,
the polymeric initiator comprises i) a polymer backbone comprising repeating functionalized ethylene units and ii) 1 to 2 nucleophilic groups linked to respective end groups of the polymer backbone, the nucleophilic groups capable of initiating the ROP of the cyclic carbonyl monomer, and
F(t) has a first derivative F'(t);
ii) providing a mathematical function D(t) expressing change in F'(t) between adjacent ROP duration times, designated ΔF'(t), as a function of ROP duration time t, wherein i) $\Delta F'(t_n) = F'(t_n) - F'(t_{n-1})$ for adjacent duration times $t_n$ and $t_{n-1}$, $t_n$, $t_n > t_{n-1}$, and n is a positive integer greater than or equal to 1, ii) D(t) has a first derivative designated D'(t), and iii) D'(t) has a duration time t'>0 wherein D'(t')=0;
iii) conducting the ROP of the cyclic carbonyl monomer using the given reaction conditions; and
iv) stopping the ROP at a polymerization duration time of 0.8t' to t', thereby forming a second mixture comprising a final block polymer capable of self-assembly, wherein the final block polymer comprises a first block comprising the polymer backbone comprising repeating functionalized ethylene units, the first block being linked by a polymer chain end group to a second block comprising a polymer backbone derived from the cyclic carbonyl monomer, and wherein the second mixture is substantially free of any polymer having a chemical structure that contains none of the polymer backbone of the polymeric initiator.

Also disclosed is a method of forming a layered structure, comprising
forming a mixture comprising a solvent and the above-described final block polymer;
applying the mixture to a pre-patterned surface of a substrate, thereby forming a first structure, the pre-patterned surface capable of guiding self-assembly of the final block polymer wherein self-assembly of the final block polymer comprises phase separation of a first block of the final block polymer from a second block of the final block polymer to form first domains comprising the first block and second domains comprising the second block, the first domains not being miscible with the second domains;
removing the solvent from the first structure, thereby forming a second structure comprising the final block polymer disposed on the surface of the substrate; and
allowing the final block polymer of the second structure to self-assemble, optionally assisted with heat, thereby forming the layered structure, the layered structure comprising the self-assembled final block polymer disposed on the pre-patterned surface.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 4A-4E are cross-sectional layer diagrams illustrating a process of forming a self-assembled block polymer layer disposed on a substrate by graphoepitaxy.

DETAILED DESCRIPTION

Figure 1:
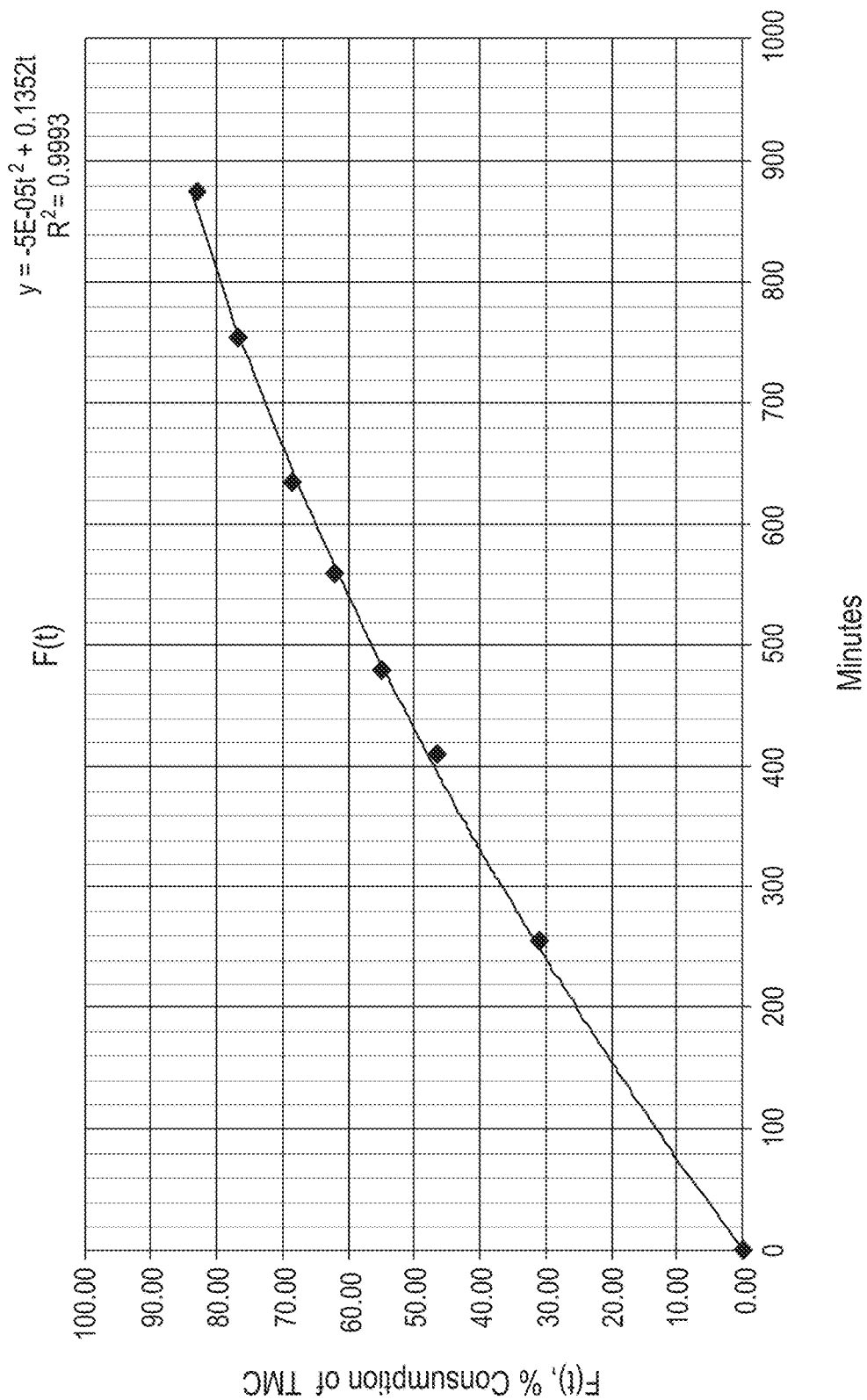
FIG. 1 is a graph of the polynomial trendline F(t) expressing percent consumption of trimethylene carbonate (TMC) as a function of ROP duration time t in minutes for the reaction conditions used in Example 44.

The disclosed methods provide block polymers for directed self-assembly that are substantially free of non-block polymer contaminants that adversely influence the self-assembly properties of the block polymer. The block polymers are also referred to herein as "final block polymers" to distinguish them from an initial block polymer that can contain polymer impurities that adversely affect self-assembly properties.

The final block polymers comprise i) a first block comprising a first polymer backbone comprising repeating functionalized ethylene units (e.g., a backbone comprising repeating units derived from a vinyl polymerizable monomer wherein $R^1$ $R^2$ are suitable pendant groups such as, for example hydrogen, alkyl, aryl, and alkoxycarbonyl) and ii) a second block comprising a second polymer backbone formed by ring opening polymerization (ROP) of one or more cyclic carbonyl monomers. "Functionalized ethylene units" of the polymer backbone are ethylene units having the structure *—[CH$_2$—C($R^1$)($R^2$)]—* comprising pendant groups R' and/or $R^2$ (e.g., hydrogen, benzene, methyl, and methoxycarbonyl pendant groups), which can result from vinyl polymerization of styrene, methacrylates, and/or acrylates, and so on. The cyclic carbonyl monomers are preferably selected from the group consisting of cyclic carbonate monomers, cyclic ester monomers, and combinations thereof.

The final block polymers preferably have 2 or 3 blocks arranged end to end in a linear, non-cyclic polymer chain. For example, a diblock polymer has an A polymer block and a B polymer block of different compositions linked together as A-B. A triblock polymer has an A block, a B block and a C block arranged in a linear, non-cyclic polymer chain as A-B-A. The central block B of the triblock polymer has a different chemical composition from the two peripheral monovalent blocks A. For example, the central block B can comprise the first polymer backbone comprising repeating functionalized ethylene units, and the two peripheral blocks A can comprise polymer backbones formed sequentially or simultaneously by ring opening polymerization (ROP) of one or more cyclic carbonyl monomers. Alternatively, the central block B can comprise a first polymer backbone formed by ring opening polymerization (ROP) of one or more cyclic carbonyl monomers, and the two peripheral blocks A can comprise polymer backbones formed sequentially or simultaneously using one or more vinyl polymerizable monomers. The peripheral monovalent blocks A of the A-B-A triblock polymer can have the same or different repeat units.

The following discussion is directed to diblock polymers (A-B) but can be applied to triblock polymers.

The first block (having a backbone comprising repeating functionalized ethylene units) and the second block (derived from a cyclic carbonyl monomer) are selected so as to be substantially immiscible with one another. Additionally, the first block and the second block of the final block polymer have the following solubility properties with respect to a solvent mixture used to precipitate the final block polymer: i) the first block and the second block are substantially insoluble in a first solvent of the solvent mixture, ii) the first block is substantially insoluble in a second solvent of the solvent mixture, and iii) the second block is soluble in a second solvent of the solvent mixture. That is, the first solvent is a non-solvent for the first block and the second block, the second solvent is a non-solvent for the first block, and the second solvent is a solvent for the second block.

The specific structural units formed by self-assembly of the final block polymer are determined by the volume ratio of the first block to the second block. The volume of a given block means the volume occupied by the block, which depends on molecular mass of the block. For example, when the volume ratio of the first block to the second block component B is greater than about 80:20, the final block polymer can form an ordered array of spheres composed of the second block in a matrix composed of the first block. When the volume ratio of the first block to the second block is in a range of about 80:20 to about 60:40, the final block polymer can form an ordered array of cylinders composed of the second block in a matrix composed of the first block. When the volume ratio of the first block to the second block is less than about 60:40 to about 40:60, the final block polymer can form alternating lamellae (i.e., domains composed of the first block alternating with domains composed of the second block). The volume ratio between the first block and the second block can be adjusted by controlling the average molecular weight of each block.

More specifically, the volume ratio of the first block to second block can be about 15:85 to about 85:15, based on the average total volume of the final block polymer macromolecule. For alternating lamellae formation, the volume ratio of the first block to second block can be about 40:60 to about 60:40, more preferably 45:55 to 55:45, and most preferably 48:52 to 52:48. For cylinder formation, the volume ratio of the first block to second block can be about 74:26 to about 63:37, and more preferably about 72:28 to about 65:35.

One of the blocks of the final block polymer can be selectively removed (e.g., by lithographic etching techniques) relative to the other block to form structural features composed of the remaining block. The structural features can have any suitable form such as, for example, a line pattern, a hole pattern, and/or other patterns.

The ROP polymeric initiator can be the product of a vinyl polymerization. Vinyl polymerizable monomers include styrenes, acrylates, methacrylates, substituted derivatives thereof, and the like. The vinyl polymerizable monomers can be used singularly or in combination to form the ROP polymeric initiator using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

The final block polymers are preferably formed by conducting a ROP of a cyclic carbonyl monomer using a pre-formed polymeric initiator for the ROP that has a polymer backbone derived from a vinyl polymerizable monomer. The polymeric initiator also comprises 1 or 2 nucleophilic groups (e.g., *—OH, *—NH$_2$) capable of initiating the ROP of the cyclic carbonyl monomer. The ROP reaction mixture comprises a cyclic carbonyl monomer, a ROP catalyst, a solvent, and the polymeric initiator. The ROP catalyst is preferably an acid catalyst (e.g., diphenyl phosphate).

The following methods of forming a diblock polymer can be applied to the preparations of triblock polymers. The methods arise from the discovery that the polymeric impurities described above are substantially formed in the later stages of the ROP, when more than 50% of the cyclic carbonyl monomer has been consumed.

Method 1

This method utilizes a solvent mixture to fractionate the initial block polymer formed when the ROP is conducted for a duration time corresponding to about 50% to 100%, more particularly about 85% to 100% consumption of the cyclic carbonyl monomer. For a given set of reaction conditions (e.g., temperature, solvent, type of atmosphere, relative molar amounts, and other reaction parameters), the consumption of the cyclic carbonyl monomer can be monitored using any suitable analytical technique (e.g., proton nuclear magnetic resonance ($^1$H NMR)).

The ROP produces an initial block polymer containing a living end group, which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block polymer containing a protected nucleophilic end group. The endcapped initial block polymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetic anhydride) to form a protected hydroxy group (e.g., as an ester). The isolated initial block polymer or the endcapped initial block polymer ("crude block polymer") can contain polymeric impurities derived from the cyclic carbonyl monomer that are not covalently linked to the polymeric initiator. Polymeric impurities can include polycarbonate homopolymer initiated by traces of water, and/or cyclic polycarbonate formed by backbiting of the living hydroxy end group on the polycarbonate backbone of the initial block polymer. These impurities can adversely affect the self-assembly properties of the initial block polymer.

The polymeric impurities can be removed by the following fractionation process. A first solution is prepared containing the initial block polymer dissolved in a minimal amount of a solvent (e.g., THF) capable of dissolving each block of the block polymer. The first solution contains the initial block polymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent that is a non-solvent for the first block and a solvent for the second block. In an embodiment, the first solvent is MeOH and the second solvent is acetonitrile. The solvent mixture selectively dissolves the polymeric impurities, allowing the final block polymer to precipitate as a solid that can be substantially free of the polymeric impurities. The fractionation procedure can be repeated one or more times as necessary to form a final block polymer for self-assembly applications.

Method 2

In a second method, a trial ROP is performed using the given set of reaction conditions that includes the polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. As an example, FIG. 1 is a graph of the percent consumption of trimethylene carbonate (TMC) as a function of ROP duration time t in minutes observed for reaction conditions used in Example 44 further below.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. For the data points of FIG. 1, $F(t) = -0.00005t^2 + 0.1352t$, having $R^2 = 0.9993$. $R^2$ (R-squared) is the coefficient of determination and indicates how well the data points fit the trendline F(t). R-squared preferably has a value of about 0.85 to 1.0, more preferably 0.9 to 1.0.

Using the expression of F(t), a time $t_1$ corresponding to 50% consumption of the cyclic carbonyl monomer can be calculated. In this instance $50 = -0.00005t_1^2 + 0.1352t_1$, and $t_1$ has a value of 442 minutes using the quadratic formula to obtain the roots.

Figure 2:
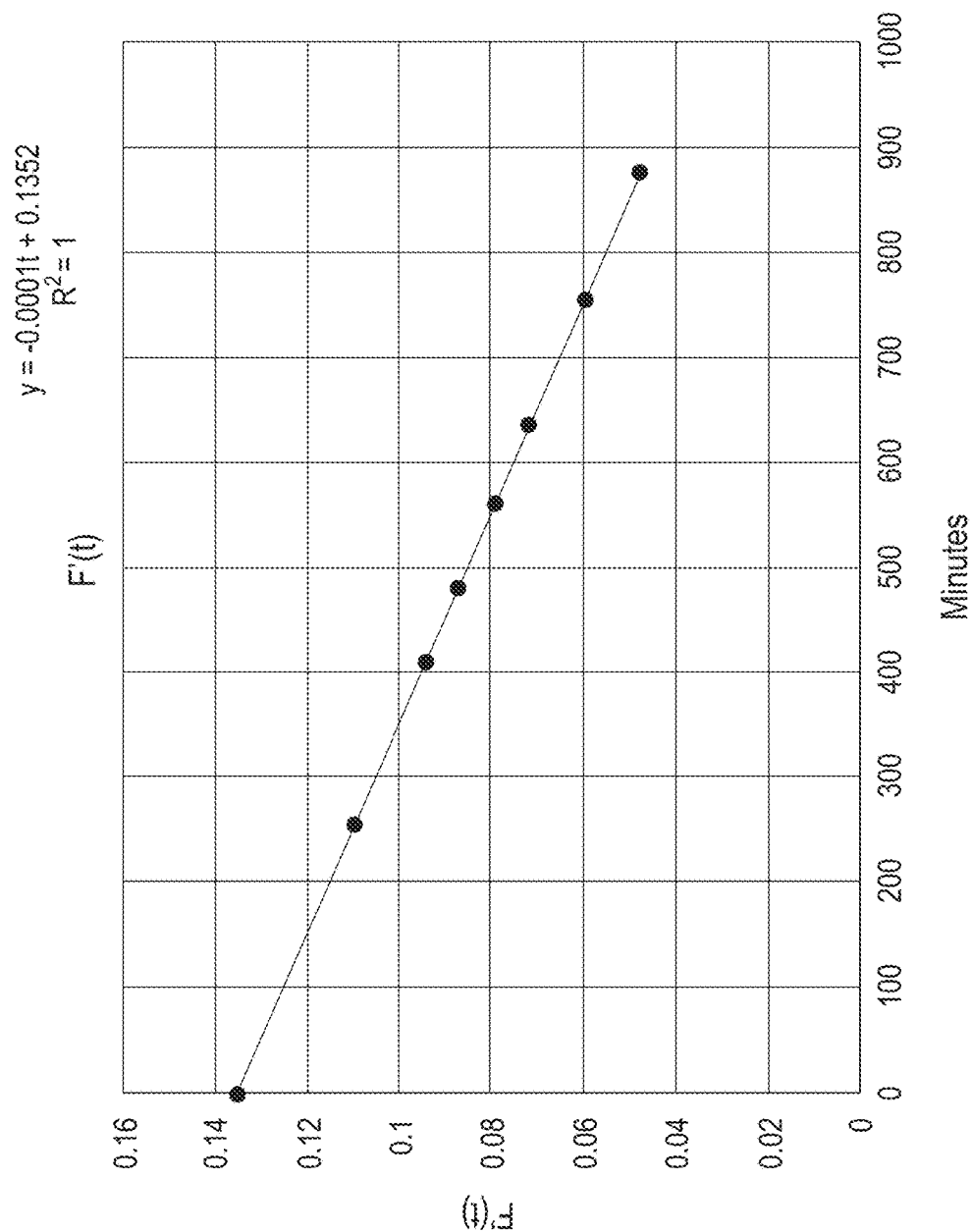
FIG. 2 is a graph of the first derivative F'(t) of the polynomial function shown in FIG. 1.

The expression F(t) has a first derivative, denoted F'(t). For Example 44, $F'(t) = -0.0001t + 0.1352$, a line (FIG. 2). Table 13 below lists the values of F'(t) calculated for each measurement time t.

The value of F'(t) at 50% cyclic monomer conversion can then be calculated. For Example 44, the value of F'(t) at $t_1 = 442$ minutes is $F'(442) = -0.0001(442) + 0.1352 = 0.091$. Using the value of F'(t) at 50% cyclic monomer conversion, ROP duration times $t_2$ and $t_3$ are calculated, which correspond to 90% of F'(442) and 80% of F'(442), respectively. That is, the duration times are determined corresponding to a slope change of −10% and −20% relative to the slope at 50% consumption of cyclic carbonyl monomer. For Example 44, 90% of F'(442) has a value of $0.9(0.091) = 0.0819$, which corresponds to a reaction time of 533 minutes ($t_2 = 533$ minutes), and 80% of F'(442) has a value of $0.8(0.091) = 0.0728$, which corresponds to a reaction time of 624 minutes ($t_3 = 624$ minutes).

The ROP is repeated using the given reaction conditions, stopping the ROP at duration time (t'), wherein $t_1 \le t' \le t_3$ (i.e., about 422 minutes to about 624 minutes in Example 44), and more preferably $t_2 \le t' \le t_3$ (i.e., about 533 minutes to about 624 minutes in Example 44). Using these modified reaction conditions, a final block polymer for self-assembly can be obtained directly that is free of, or substantially free of, polymer impurities that do not comprise a block derived from the polymeric initiator. Optionally, the block polymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as $\Delta F'(t_n)$, is equal to $F'(t_n) - F'(t_{n-1})$, where n is a positive integer and $t_n > 0$. Table 14 below lists $\Delta F'(t)$ at each duration time t for Example 44.

Figure 3:
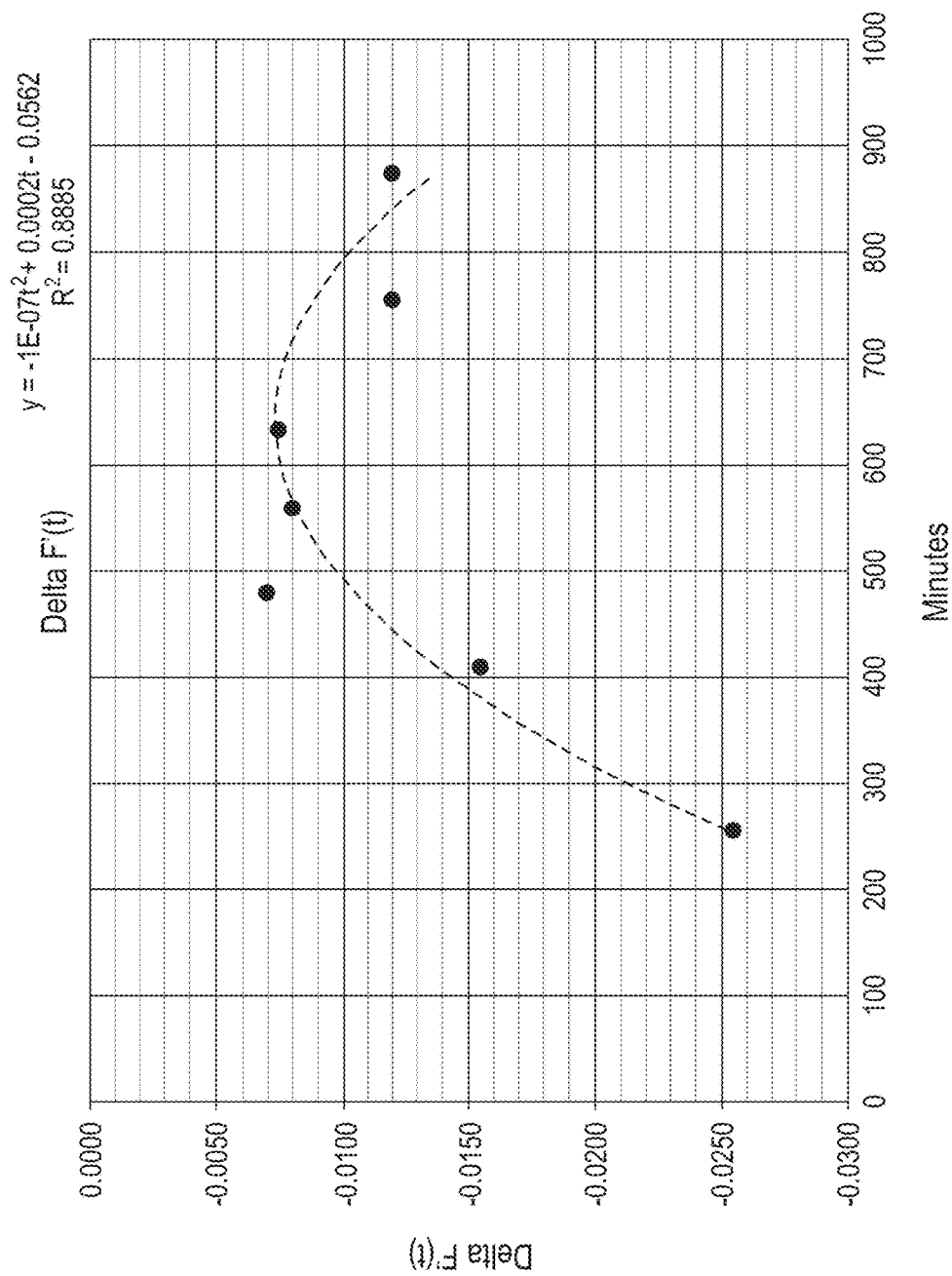
FIG. 3 is a graph of the second order polynomial trendline D(t) obtained for a scatter plot of ΔF'(t) as a function of t for Example 44.

A second order polynomial trendline D(t) is obtained for a scatter plot of $\Delta F'(t)$ as a function of t, shown in FIG. 3 for Example 44. In this instance, trendline D(t) has the shape of an inverted parabola, wherein $D(t)=-0.0000001t^2+0.0002t-0.0562$, having an R-squared value of 0.8885. D(t) has a first derivative D'(t) equal to zero at a ROP duration time t">0 which is less than the duration time corresponding to 100% consumption of the cyclic carbonyl monomer. For Example 44, D'(t)=0 at about 630 minutes (i.e., t"=630 minutes).

The ROP is repeated using the given reaction conditions, terminating the ROP at 0.8t" to about t" (about 504 minutes to about 630 minutes). The resulting final block polymer can be free of, or substantially free of, polymer impurities that do not comprise a block derived from the polymeric initiator. Optionally, the final block polymer can be further treated with the solvent mixture as described above under Method 1 to remove any polymeric impurities present.

Cyclic Carbonyl Monomers

A polymer block derived from cyclic carbonyl monomer can be a homopolymer or a random copolymer. The cyclic carbonyl monomers can be stereospecific or non-stereospecific.

Exemplary cyclic carbonyl monomers include cyclic carbonate compounds of Table 1, which can be used, for example, to form a polycarbonate block of the initial block polymer.

TABLE 1

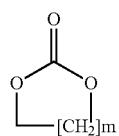

m = 1, Trimethylene carbonate (TMC)
m = 2, Tetramethylene carbonate (TEMC)
m = 3, Pentamethylene carbonate (PMC)

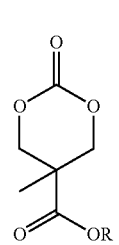

R = hydrogen, (MTCOH)
R = methyl (MTCOMe)
R = t-butyl (MTCO$^t$Bu)
R = ethyl (MTCOEt)

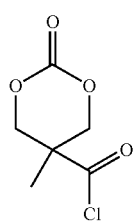

(MTCCl)

TABLE 1-continued

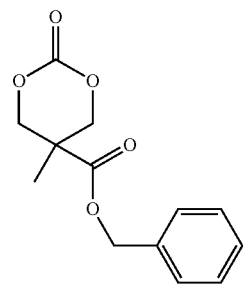 [SMILES: CC1(C(=O)OCc2ccccc2)COC(=O)OC1]

(MTCOBn)

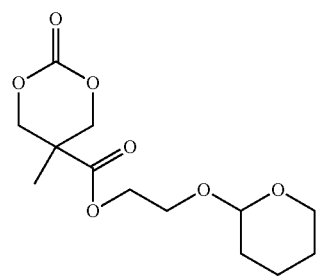 [SMILES: CC1(C(=O)OCCOC2CCCCO2)COC(=O)OC1]

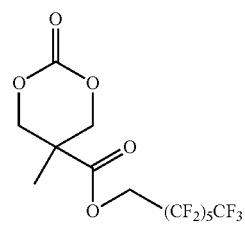

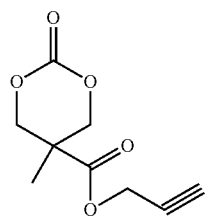

(MTCTFE)

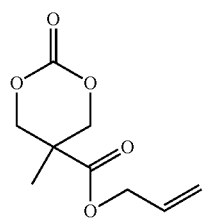

TABLE 1-continued

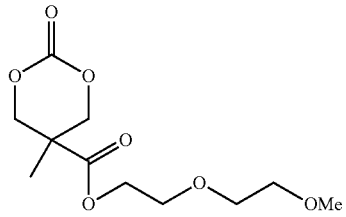 [SMILES: COCCOCCOC(=O)C1(C)COC(=O)OC1]

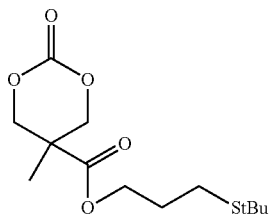

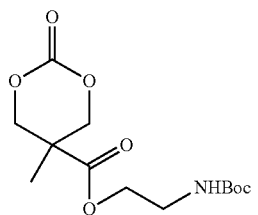 [SMILES: CC(C)(C)OC(=O)NCCOC(=O)C1(C)COC(=O)OC1]

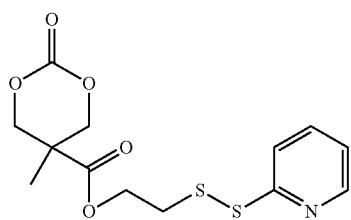 [SMILES: CC1(C(=O)OCCSSc2ccccn2)COC(=O)OC1]

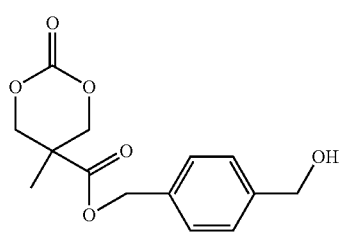 [SMILES: CC1(C(=O)OCc2ccc(CO)cc2)COC(=O)OC1]

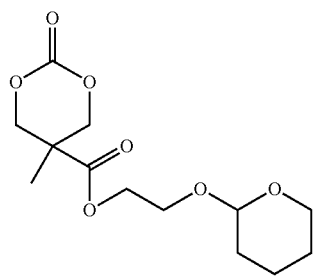 [SMILES: CC1(C(=O)OCCOC2CCCCO2)COC(=O)OC1]

TABLE 1-continued

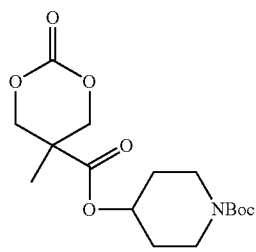 [SMILES: CC(C)(C)OC(=O)N1CCC(OC(=O)C2(C)COC(=O)OC2)CC1]

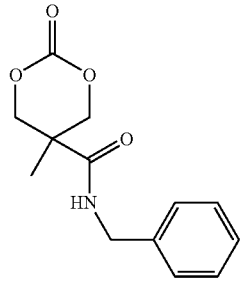 [SMILES: CC1(C(=O)NCc2ccccc2)COC(=O)OC1]

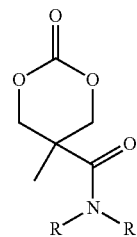

R = methyl
R = iso-propyl

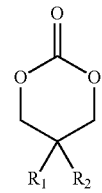

$R_1 = R_2$ = Methyl
$R_1$ = Methyl, $R_2$ = H
$R_1 = R_2$ = ethyl
$R_1$ = ethyl, $R_2$ = H Other cyclic carbonyl monomers include cyclic esters (lactones), such as the compounds of Table 2.

TABLE 2

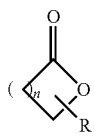

R = H, n = 1: beta-Propiolactone (b-PL)
R = H, n = 2: gamma-Butyrolactone (g-BL)
R = H, n = 3: delta-Valerolactone (d-VL)
R = H, n = 4: epsilon-Caprolactone (e-CL)
R = $CH_3$, n = 1: beta-Butyrolactone (b-BL)
R = $CH_3$, n = 2: gamma-Valerolactone (g-VL)

TABLE 2-continued
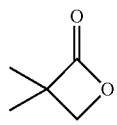
Pivalolactone (PVL)
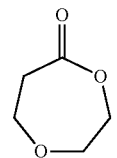
1,5-Dioxepan-2-one
(DXO)
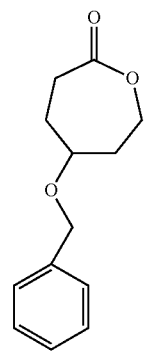 [SMILES: O=C1CCC(OCc2ccccc2)CCO1]
5-(Benzyloxy)oxepan-2-one
(BXO)
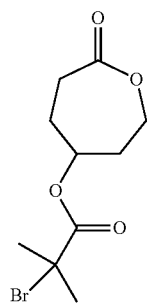
7-Oxooxepan-4-yl 2-bromo-2-
methylpropanoate
(BMP-XO)
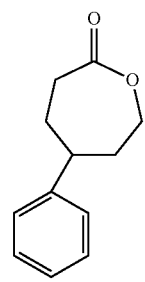 [SMILES: O=C1CCC(c2ccccc2)CCO1]
5-Phenyloxepan-2-one
(PXO)
TABLE 2-continued
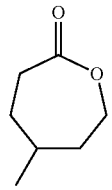
5-Methyloxepan-2-one
(MXO)
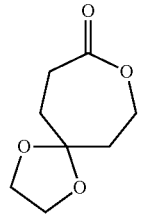 [SMILES: O=C1CCC2(CCO1)OCCO2]
1,4,8-Trioxa(4,6)spiro-9-undecane
(TOSUO)
5-(Benzyloxymethyl)oxepan-2-one
(BOMXO)
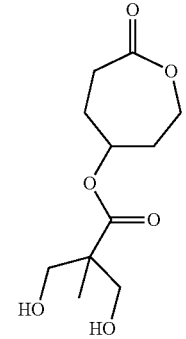
7-Oxooxepan-4-yl 3-hydroxy-
2-(hydroxymethyl)-2-methylpropanoate
(OX-BHMP)
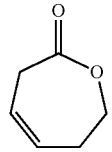
(Z)-6,7-Dihydrooxepin-2(3H)-one
(DHXO)

TABLE 2-continued

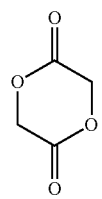

Glycolide
(GLY)

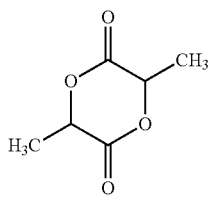

D-Lactide (DLA)
L-Lactide (LLA)
racemic Lactide, 1:1 D:L forms (DLLA)

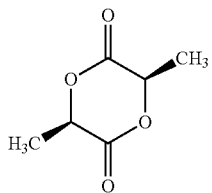

meso-Lactide (MLA)
(two opposite centers of asymmetry,
R and S)

The above cyclic carbonyl monomers can be purified by recrystallization from a solvent such as ethyl acetate or by other known methods of purification, with particular attention being paid to removing as much water as possible from the monomer.

ROP Initiators

Initiators for ring opening polymerizations generally include nucleophilic groups such as alcohols, primary amines, secondary amines, and thiols. Herein, the ROP initiator is a polymeric initiator comprising a polymer backbone derived from a polymerizable vinyl monomer (styrenes, methacrylates, acrylates, methacrylamides, acrylamides, vinyl esters). An exemplary polymeric intiator is the functionalized polystyrene initiator PS-OH shown below.

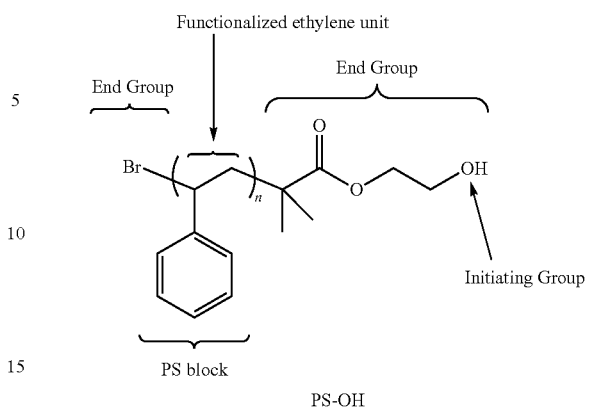

PS-OH

The polymeric initiator preferably comprises one or two nucleophilic hydroxy groups for initiating a ROP and forming diblock and triblock polymers, respectively. The number average molecular weight of the polymeric initiator can be from 1000 to 1,000,000, more specifically 1000 to 100,000, and even more specifically, 1000 to 50,000.

Ring Opening Polymerizations (ROP)

The following description of methods, conditions and materials for ring opening polymerizations is applicable to the preparation of the final block polymer.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent. Optional solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

Whether performed in solution or in bulk, the ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Exemplary catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-isopropoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the catalyst is zirconium octanoate, tetraalkoxy zirconium or a trialkoxy aluminum compound.

Other ROP catalysts are organocatalysts whose chemical formula contains no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

A thiourea ROP organocatalyst is N-(3,5-trifluoromethyl)phenyl-N'-cyclohexyl-thiourea (TU):

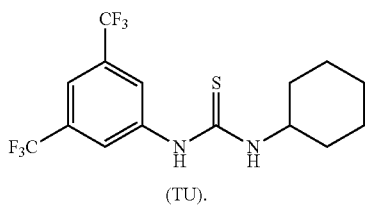

(TU).

Other ROP organocatalysts comprise at least one 1,1,1,3,3,3-hexafluoropropan-2-ol-2-yl (HFP) group. Singly-donating hydrogen bond catalysts have the formula (1):

wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalklyl group, aryl group, substituted aryl group, or a combination thereof. Exemplary singly-donating hydrogen bonding catalysts are listed in Table 3.

TABLE 3

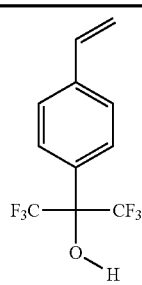

4-HFA-St

TABLE 3-continued

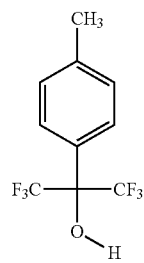

4-HFA-Tol

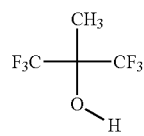

HFTB

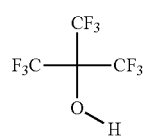

NFTB

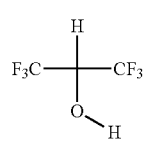

HFIP

Doubly-donating hydrogen bonding catalysts have two HFP groups, represented by the general formula (13):

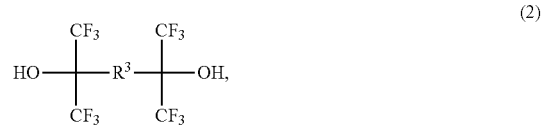

wherein $R^3$ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, and a combination thereof. Representative double hydrogen bonding catalysts of formula (2) include those listed in Table 4. In a specific embodiment, $R^2$ is an arylene or substituted arylene group, and the HFP groups occupy positions meta to each other on the aromatic ring.

TABLE 4

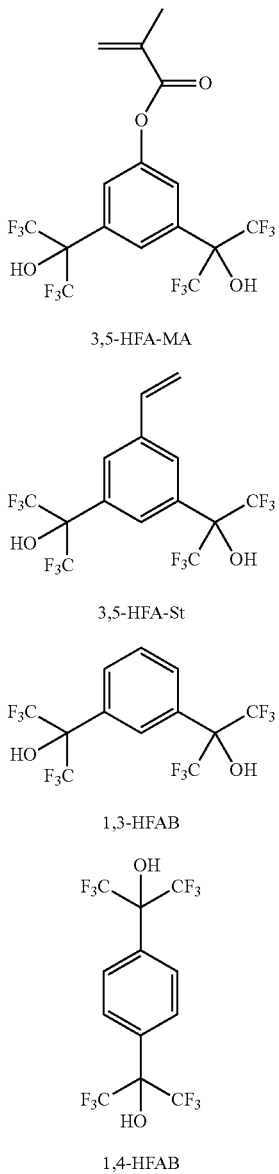

3,5-HFA-MA 3,5-HFA-St 1,3-HFAB 1,4-HFAB

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof.

The HFP catalyst can be bound to a support. In one embodiment, the support comprises a polymer, a crosslinked polymer bead, an inorganic particle, or a metallic particle. HFP-containing polymers can be formed by known methods including direct polymerization of an HFP-containing monomer (for example, the methacrylate monomer 3,5-HFA-MA or the styryl monomer 3,5-HFA-St). Functional groups in HFP-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl, a $C_1$-$C_{12}$ heteroalkyl, ether group, thioether group, amino group, ester group, amide group, or a combination thereof. Also contemplated are catalysts comprising charged HFP-containing groups bound by ionic association to oppositely charged sites on a polymer or a support surface.

Most preferably, the ROP catalyst is an acid organocatalyst (e.g., diphenylphosphate (DPP), triflic acid).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators.

The ROP polymerization can be conducted in the presence of an optional accelerator, in particular a nitrogen base. Exemplary nitrogen base accelerators are listed below and include pyridine (Py), N,N-dimethylaminocyclohexane (Me2NCy), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene (Im-3), 1,3-bis(1-adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Table 5.

TABLE 5

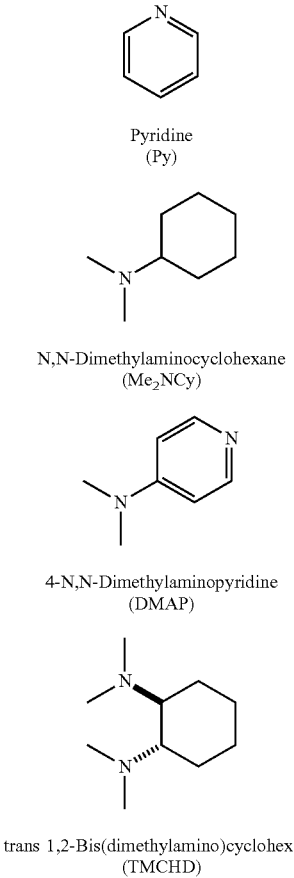

Pyridine (Py)

N,N-Dimethylaminocyclohexane (Me₂NCy)

4-N,N-Dimethylaminopyridine (DMAP)

trans 1,2-Bis(dimethylamino)cyclohexane (TMCHD)

TABLE 5-continued

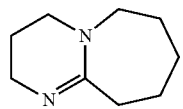

1,8-Diazabicyclo[5.4.0]undec-7-ene
(DBU)

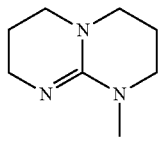

7-Methyl-1,5,7-triazabicyclo[4.4.0]dec-5-ene
(MTBD)

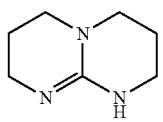

1,5,7-Triazabicyclo[4.4.0]dec-5-ene
(TBD)

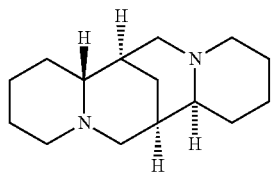 [SMILES: C1CCN2C[C@H]3C[C@H](CN4CCCC[C@@H]34)[C@H]2C1]

(−)-Sparteine
(Sp)

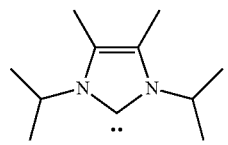

1,3-Bis(2-propyl)-4,5-dimethylimidazol-2-ylidene
(Im-1)

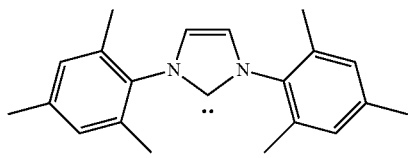

1,3-Bis(2,4,6-trimethylphenyl)imidazol-2-ylidene
(Im-2)

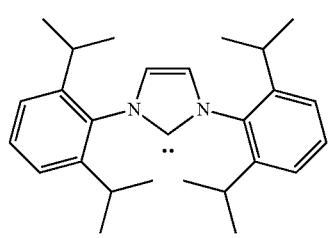

1,3-Bis(2,6-di-i-propylphenyl(imidazol-2-ylidene
(Im-3)

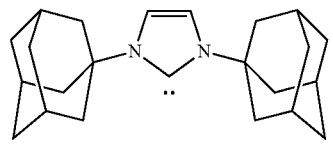

1,3-Bis(1-adamantyl)imidazol-2-yliden)
(Im-4)

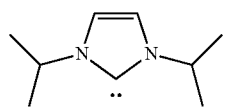

1,3-Di-i-propylimidazol-2-ylidene
(Im-5)

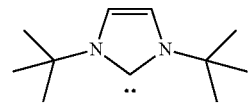

1,3-Di-t-butylimidazol-2-ylidene
(Im-6)

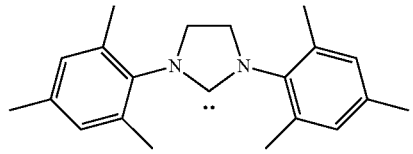

1,3-Bis(2,4,6-trimethylphenyl)-4,5-dihydroimidazol-2-ylidene
(Im-7)

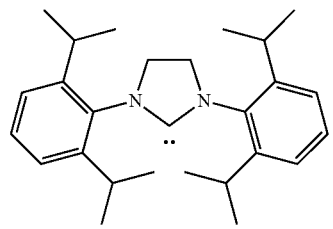

1,3-Bis(2,6-di-i-propylphenyl)-4,5-dihydroimidazol-2-ylidene
(Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of initiator is calculated based on the equivalent molecular weight per nucleophilic initiator group in the dinucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block polymer can comprise residual catalyst in an amount greater than 0 wt % (weight percent), based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

Average Molecular Weight.

The final block polymer preferably has a number average molecular weight Mn as determined by size exclusion chromatography of at least 1500 g/mol, more specifically 1500 g/mol to 1,000,000 g/mol, 4000 g/mol to 150000 g/mol, or 4000 g/mol to 50000 g/mol. In an embodiment, the final block polymer has a number average molecular weight Mn of 10,000 to 20,000 g/mole. The final block polymer also preferably has a narrow polydispersity index (PDI), generally from 1.01 to 2.0, more particularly 1.01 to 1.30, and even more particularly 1.01 to 1.25.

Layered Structures

Directed polymer self-assembly (DSA) can potentially extend current lithography by enhancing the spatial resolution and/or controlling the critical dimension variation of a predefined pattern on a substrate. DSA can be implemented by graphoepitaxy and/or chemical epitaxy. In graphoepitaxy, self-assembly (SA) of a material (e.g., a block polymer) is guided by topographical features of a lithographically pre-patterned surface and the surface properties of those features. In chemical epitaxy, self-assembly of a material is guided by lithographically defined chemical pre-patterns of a substrate surface.

Figure 4A:
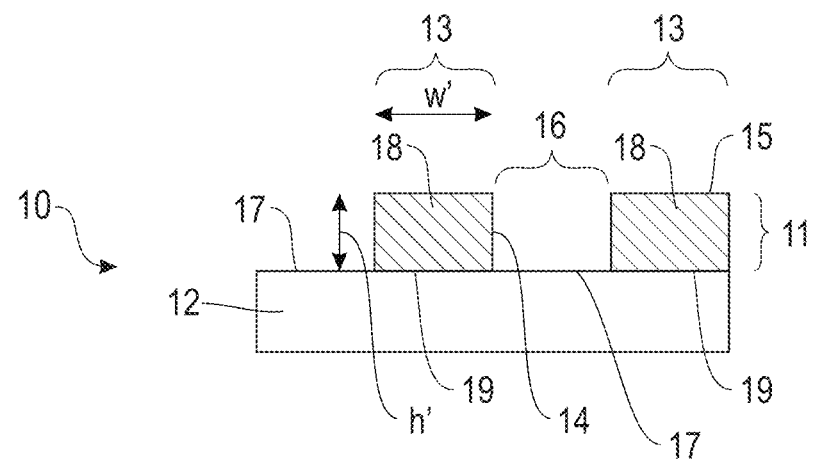

FIGS. 4A to 4E are cross-sectional layer diagrams illustrating DSA by graphoepitaxy. Layered structure 10 comprises topographic pre-pattern 11 disposed on substrate 12 (FIG. 4A). Substrate 12 can comprise one or more sub-layers (not shown). Pre-pattern 11 comprises topographical features 13 disposed on substrate surface 19. Features 13 have sidewalls 14, top surface 15, height h', and width w'. Features 13 are separated by trench areas 16 having bottom surface 17, which can be a surface of substrate 12 or a sub-layer thereof (not shown). Pre-pattern 11 can be formed by any suitable lithographic technique. Features 13 can comprise any suitable material 18 for directing self-assembly. For example, features 13 can comprise a resist material, which can be a positive and/or negative tone resist material.

The topography of pre-pattern 11 guides self-assembly of the final block polymer, which is allocated in the trench area of features 13. For graphoepitaxy, the thickness (i.e., height h') of features 13 is typically greater than or comparable to the thickness of the block polymer undergoing self-assembly. Additionally, the surface properties of sidewalls 14 and bottom surface 17 should be suitable for guiding self-assembly of the block polymer. In particular, one domain of the self-assembled final block polymer should have a higher affinity for sidewalls 14 and/or bottom surface 17 compared to a second domain of the self-assembled final block polymer.

Figure 4B:
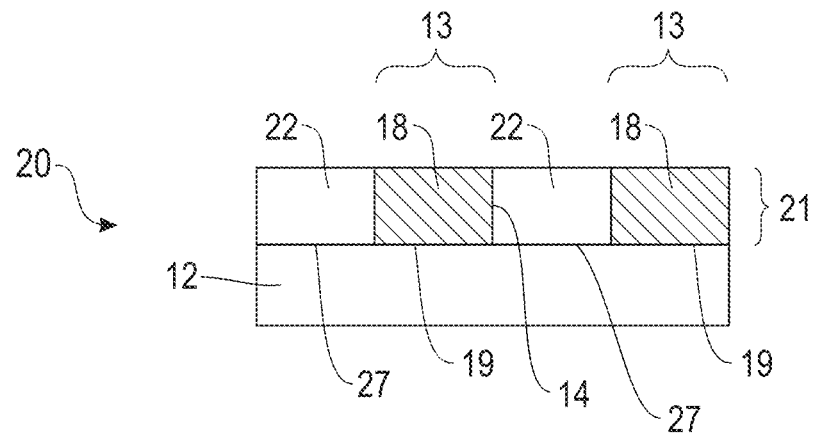

A coating mixture comprising the final block polymer, a suitable solvent, and any optional additives is applied to pre-pattern 11 using any suitable technique (e.g., spin coating), thereby allocating the final block polymer substantially in trench areas 16. Pre-pattern 11 is insoluble in or substantially insoluble in the solvent used to prepare the coating mixture. Removal of the solvent from the applied coating mixture provides layered structure 20 comprising layer 21 (FIG. 4B). Layer 21 comprises features 13 and regions of final block polymer 22 disposed on bottom surface 27 of trench areas 16.

Figure 4C:
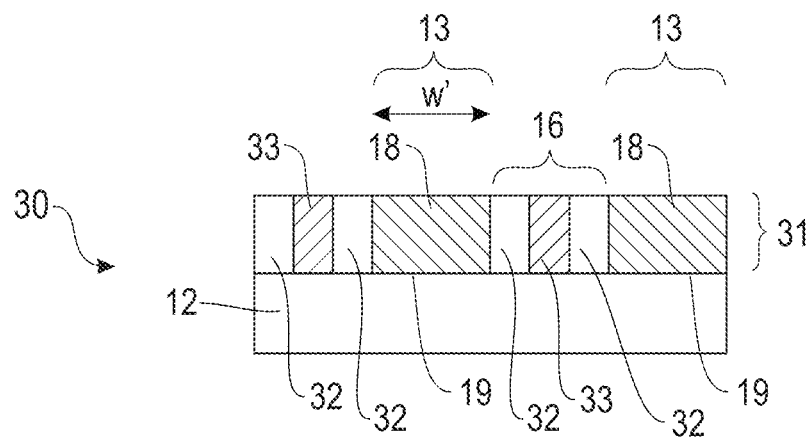

Final block polymer 22 can self-assemble (phase separate) to form layered structure 30 comprising self-assembled layer 31 (FIG. 4C). Self-assembly can be spontaneous and/or assisted by a thermally treating (annealing) layer 21. Self-assembled layer 31 comprises first domains 32, second domains 33, features 13, and trench areas 16.

Figure 4D:
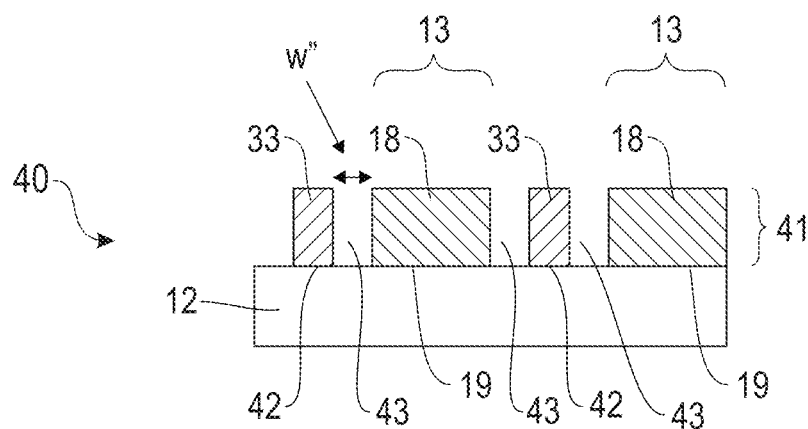

One of the domains, for example first domains 32, can be selectively removed (e.g., ion-etched) or modified in the presence of the second domains 33, to generate topographical or chemical contrast. Selective removal of one of the domains can also remove underlying orientation control material (not shown), producing layered structure 40 comprising relief pattern 41 (FIG. 4D). An orientation control material can be any suitable material for controlling self-assembly of the final block polymer. Relief pattern 41 comprises second domains 33 disposed on bottom surface 42, openings 43, and features 13. Openings 43 can have a width w'' of about 3 nm to about 100 nm. The selective removal process may be carried out by a thermal bake (for thermally decomposable materials), a reactive ion etch process, dissolution in a selective solvent, or a combination thereof. A chemical modification may be accomplished by a variety of known methods. For example, domains may be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

Finally, relief pattern 41 can be transferred to substrate 12, thereby forming layered structure 50 comprising patterned region 51 of substrate 12 (FIG. 4E). Patterned region 51 can be a pattern of lines, holes, pits, or a chemically altered state of the substrate material represented by areas 52. Patterned region 51 can extend into one or more layers of substrate 12. The pattern transfer can be accomplished, for example, by using a reactive ion etch process.

Figure 5A:
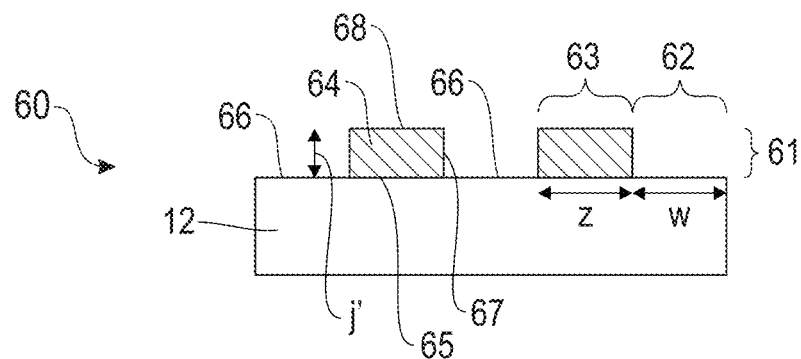
FIGS. 5A-5D are cross-sectional layer diagrams illustrating a process of forming a self-assembled block polymer layer disposed on a substrate by chemical epitaxy.

Chemical epitaxy is further illustrated in the process of FIGS. 5A to 5D. In FIG. 5A, layered structure 60 is composed of a pre-pattern 61 comprising uncovered substrate surfaces 62 and features 63. Features 63 have height j', top surface 68, sidewalls 67 and can comprise any suitable material 64 disposed on surface 65 of substrate 12. The trench area 62 has width w and feature 63 have width z. The pitch (w+z) is about the pitch of the self-assembled material (e.g., block polymer). Pre-pattern 61 is not soluble in a solvent used to form a coating mixture comprising the final block polymer. In this example pre-pattern 61 and substrate surface 66 provide a chemical pre-pattern for self-assembly of the final block polymer. Height j' of trench 63 is small enough relative to the thickness of the final block copolymer that sidewall 67 has negligible influence on self-assembly; that is, self-assembly is controlled primarily by top surface 68 and substrate surface 66. In this case, top surface 68 and substrate surface 66 have different surface wetting properties for the final block polymer. Self-assembly can be directed by top surface 68 or by substrate surface 66, or both when each surface has a preferential affinity for a different domain of the self-assembled material. In this example, top surface 68 has a preferential affinity for domain 76 of the self-assembled material (FIG. 4B). The surface properties of photoresist top surface 68 can be modified to tune the chemical affinity prior to application of the SA materials. The height j (i.e., thickness) of the non-crosslinked, exposed photoresist 62 should be less than the thickness of the SA materials in order to direct self-assembly primarily by chemical interactions. The properties of substrate surface 66 can be the same, or substantially the same as, the properties of substrate surface 12.

Figure 5B:
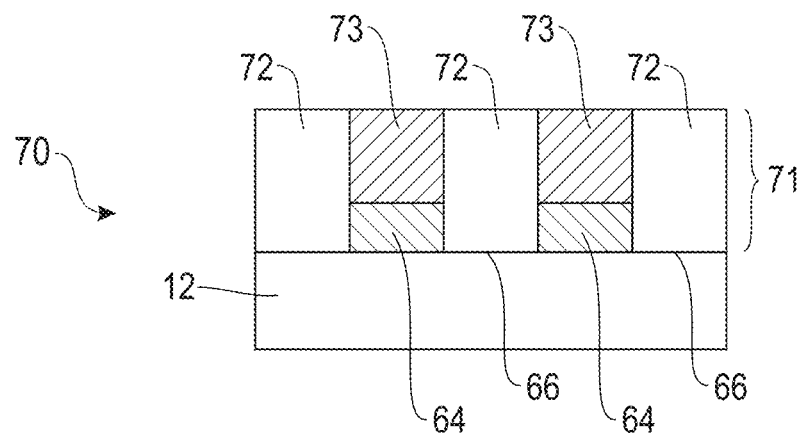

A solution comprising the final block polymer and a suitable solvent is cast onto pre-pattern 61 without dissolving features 63. Removing of the solvent and optionally baking and/or annealing of the layer results in layered structure 70 comprising a domain pattern 71 (FIG. 5B). Domain pattern 71 comprises first domains 72 of self-assembled final block polymer, which are disposed on substrate surface 66, and second domains 73 of self-assembled final block polymer disposed on top surface 68 of features 63 (FIG. 5A). In this example, top surface 68 of features 63 has a preferential affinity for domains 73; therefore, domains 73 preferentially self-assemble on top surface 68. Additionally, substrate surface 66 can have a preferential affinity for domain 72, but not for domain 73. Alternatively, substrate 66 can have no preferential affinity for either domains 72 or 73, but can support the perpendicular orientation of both domains 72 or 73. In such a fashion, pre-pattern 61 guides the location of the self-assembled domains of the final block polymer.

Figure 5C:
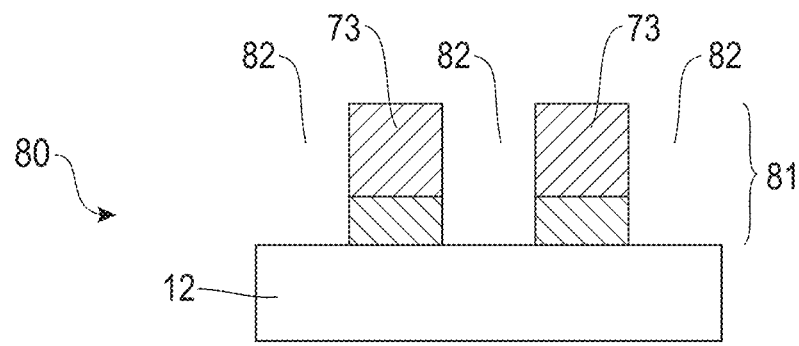
Figure 5D:
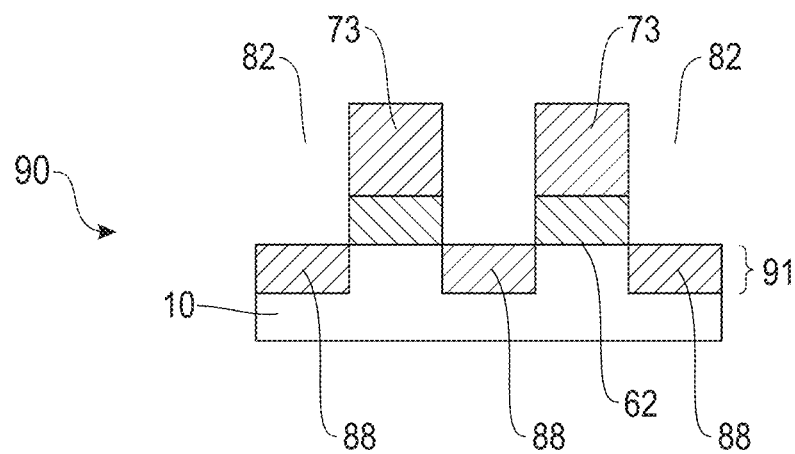

One of the domains 72 or 73 can be selectively removed in the presence of the other domain. In this example first domains 72 are selectively removed, producing layered structure 80 comprising relief pattern 81 (FIG. 5C). Relief pattern 81 comprises openings 82 that allow a pattern to be transferred to substrate 12, producing layered structure 90 comprising altered substrate pattern 91 (FIG. 5D). Pattern 91 comprises altered substrate regions 92. In this example the width (w) of trench area 62 plus the width (z) of the feature 63 (FIG. 5A) is about equal to the pitch of self-assembled material of domain pattern 71 (FIG. 5B), which produces no change in the spatial frequency of the domain pattern relative to the pre-pattern 61.

In general, width z of the feature 63 can be larger or smaller than the width of the domain 73 for which it has preferential affinity. The pitch of the chemical pre-pattern (w+z) should be roughly commensurate with an integral multiple of the pitch of the self-assembled domains of block polymers. For guiding self-assembly of a final block polymer, the pitch of the chemical pre-pattern (w+z) should be roughly an integral multiple of the dimensions of the self-assembled domains of the final block polymer.

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have a top anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

The substrate can comprise an orientation control layer. Exemplary orientation control materials include polymers comprising a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)). Other orientation control materials include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjunction with an additional crosslinking agent. In particular, a catalytic species such as a strongly acidic species may be used to facilitate reaction. The strongly acidic species may be directly incorporated into the orientation control material or the solution comprising the orientation control material. Alternatively, a thermal acid generator or photoacid generator molecule may be used to generate an acidic species as a result of thermal or photochemical treatment, respectively.

Other non-limiting examples of orientation control materials include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components can also contain a plurality of reactive sites distributed along the polymer for reaction with a crosslinking component. More specific materials used in ARC layers include polymers disclosed in US Patent Application 20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl endcapped poly(bisphenol A-co-epichlorohydrin), and silicon-containing anti-reflection coating A940 from Shin Etsu. Another more specific orientation control material described in U.S. Pat. No. 7,521,090 comprises poly(styrene-co-epoxydicyclopentadiene methacrylate) random copolymer, P(S-r-EDCPMA):

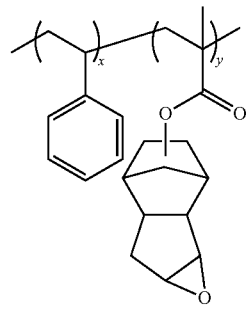

P(S-r-EDCPMA), wherein x and y are each integers greater than 1. Other orientation control materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other orientation control materials comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other orientation control materials include self-assembled monolayers.

The following examples illustrate the methods of forming the final block polymers and layered structures that utilize the self-assembly properties of the final block polymers.

EXAMPLES

Materials used in the following examples are listed in Table 6.

TABLE 6

| ABBREVIATION | DESCRIPTION | SUPPLIER |
|---|---|---|
| DBU | 1,8-Diazabicyclo[5,4,0]undec-7-ene | Sigma Aldrich |
| BisMPA | Dimethylolpropinoic acid | Perstorp |
| BnOH | Benzyl alcohol | Sigma Aldrich |
| DCM | Dichloromethane | Sigma Aldrich |
| AcCl | Acetyl Chloride | Sigma Aldrich |
| TEA | Triethylamine | Sigma Aldrich |
| BriBr | α-Bromoisobutyryl bromide | Sigma Aldrich |
| THF | Tetrahydrofuran | Sigma Aldrich |
| MeOH | Methanol | Sigma Aldrich |
| ACN | Acetonitrile | Sigma Aldrich |
| Sty | Styrene | Sigma Aldrich |
| GMA | Glycidyl methacrylate | Sigma Aldrich |
| ACN | Acrylonitrile | Sigma Aldrich |
|  | Ethyl chloroformate | Sigma Aldrich |
| EtAc | Ethyl acetate | Sigma Aldrich |
| Tol | Toluene | Sigma Aldrich |
| DPP | Diphenyl phosphate, MW 250.2 | Sigma Aldrich |
| AIBN | Azobisisobutyronitrile | Sigma Aldrich |
| EG | Ethylene glycol | Sigma Aldrich |
| PS—OH | Hydroxyl- end-functional polystyrene; Mn = 6200 Mn = 10000 | AZ Electronic Materials |

TABLE 6-continued

| ABBRE-VIATION | DESCRIPTION | SUPPLIER |
|---|---|---|
| P2O5 | Phosphorus pentaoxide | Aldrich |
| TMC | Trimethylene carbonate | Richman Chemicals |
| CuBr | Copper (I) bromide | Sigma Aldrich |
| PMDETA | N,N,N',N',N''-pentamethyldiethylenetriamine | Sigma Aldrich |
| Anisole | Anisole | Sigma Aldrich |
| Si Gel | Silica Gel | Sigma Aldrich |

Herein, Mn is the number average molecular weight, Mw is the weight average molecular weight, and MW is the molecular weight of one molecule.

All solvents were of analytical grade, and used as received. Before transferring into the glove box, monomers and other reagents (e.g., initiator, monomer, etc.) were dried extensively by freeze-drying under high vacuum.

ATRP initiator, 2-hydroxyethyl 2-bromo-2-methylpropanoate,

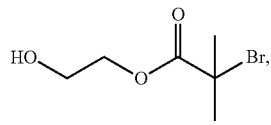

was prepared as previously reported (C. Koulic et al., Polymer, 2001, 42, 7, 2947).

Methyl carbonate (MTC-Me) monomer:

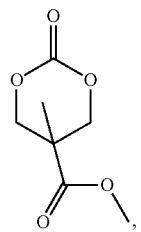

was prepared as previously reported (Y. Zoul et al., Polymer, 45(16), 5459-5463; 2004).

Example 1. Synthesis of P-1 Homopolymer Using DBU Catalyst

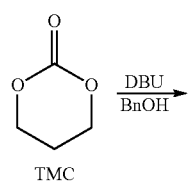

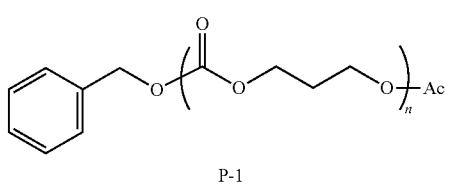

P-1

To an oven dried 4 ml glass vial equipped with a magnetic stir bar, as-purchased TMC (0.3 g, 2.94 mmol), benzyl alcohol (BnOH, 5.29 mg, 0.049 mmol), and DCM (0.4 ml) were added. The reaction mixture was stirred until TMC was completely dissolved in DCM, upon which DBU (22 mg, 0.147 mmol) was added. The reaction mixture was stirred at room temperature for 85 minutes in a glove box. The reaction was stopped by bringing the reaction vial out of the glove box and by adding acetyl chloride (30 mg, 0.384 mmol) and further stirring the reaction mixture for 45 minutes at room temperature. The polymer was precipitated in cold methanol (0° C.). Methanol was decanted and the polymer was dried in a vacuum oven at room temperature. The dried polymer was further purified by dissolving in THF and reprecipitating in cold methanol (0° C.). Methanol was decanted and the polymer was dried in a vacuum oven at room temperature to obtain the final product. Mn=6.5 k, Mw=7.2 k, PDI=1.10, n=62.

Example 2. Synthesis of P-2 Homopolymer Using DPP Catalyst

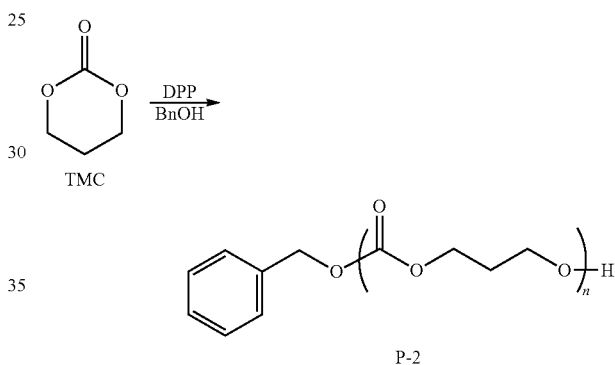

P-2

To an oven dried 4 ml glass vial equipped with a magnetic stir bar, as-purchased TMC (0.278 g, 2.72 mmol), benzyl alcohol (2.94 mg, 0.027 mmol), and DCM (0.46 ml) were added. The reaction mixture was stirred until a TMC was completely dissolved in DCM, upon which DPP (68 mg, 272 mmol) was added. The reaction mixture was stirred at room temperature for 2.5 hours in a glove box. The reaction was stopped by bringing the reaction vial out of the glove box and by adding TEA (27 mg, 0.272 mmol) and further stirring the reaction mixture for 45 minutes at room temperature. The polymer was precipitated in cold methanol (0° C.). Methanol was decanted and the polymer was dried in a vacuum oven at room temperature. The dried polymer was further purified by dissolving in THF and reprecipitating in cold methanol (0° C.). Methanol was decanted and the polymer was dried in a vacuum oven at room temperature to obtain the final product. Mn=2.98 k, Mw=3.1 k, PDI=1.06, n=28.

Example 3. Recrystallization of TMC Monomer from Ethyl Acetate

Figure 6:
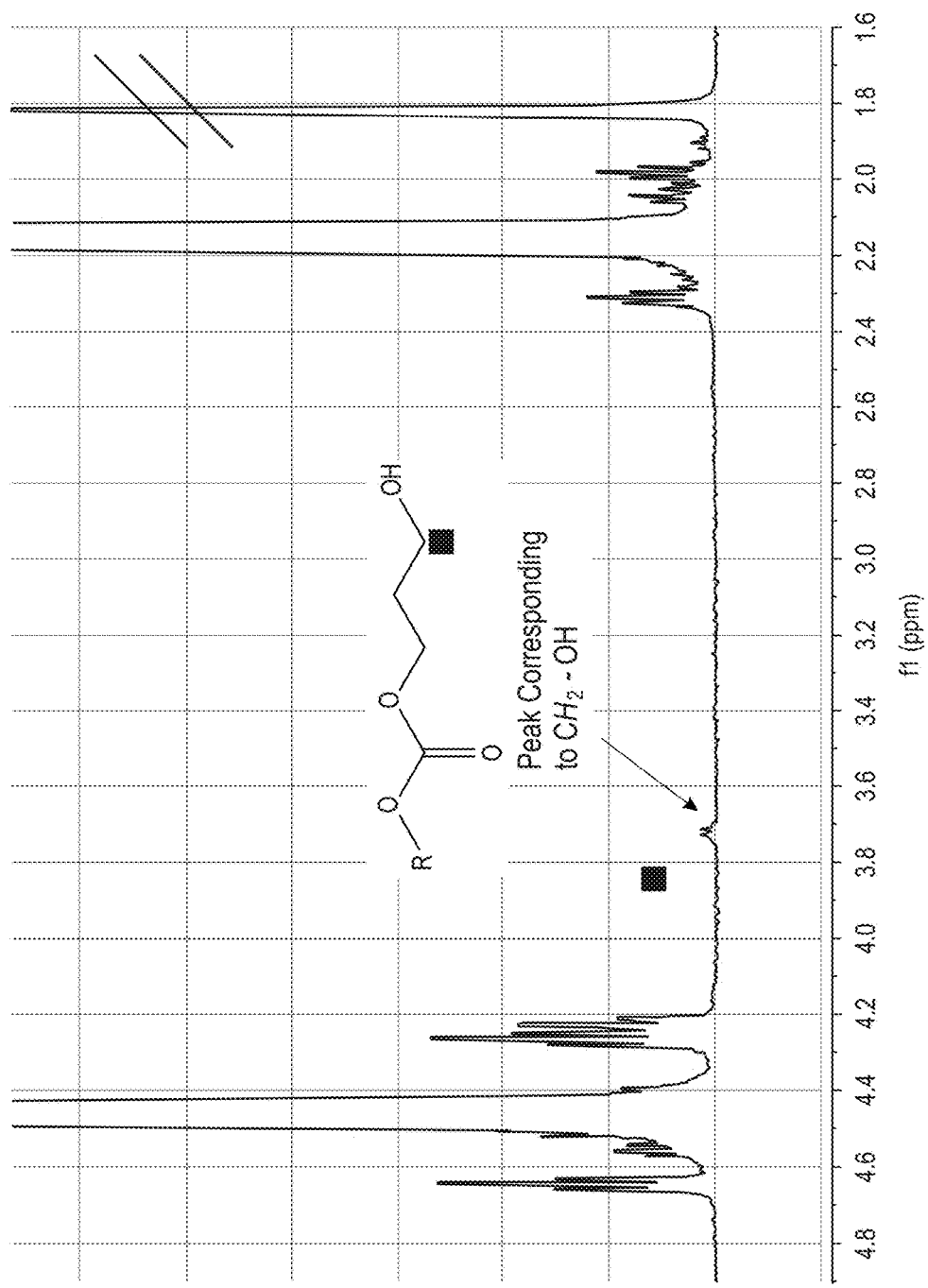
FIG. 6 is a proton NMR spectrum of the TMC after drying with Abderhalden's drying apparatus (Example 3).

To a 100 ml round bottom flask equipped with a magnetic stir bar, TMC (10.0 g, 98 mmol) and ethyl acetate (10 ml) were added. The reaction mixture was heated in an oil-bath at 40° C. until the TMC completely dissolved in ethyl acetate to form a clear mixture. At this point, the heating was stopped and the TMC was allowed to crystallize from ethyl acetate. TMC was isolated in a frit funnel by removing ethyl acetate under vacuum. The TMC was dried at room temperature under vacuum for one day. The resulting TMC monomer was further dried using Abderhalden's drying pistol apparatus with phosphorus pentoxide in the trap to collect residual moisture. FIG. 6 is a proton NMR spectrum of the TMC after drying with Abderhalden's drying apparatus.

Example 4. Recrystallization of TMC Monomer from Toluene

Figure 7:
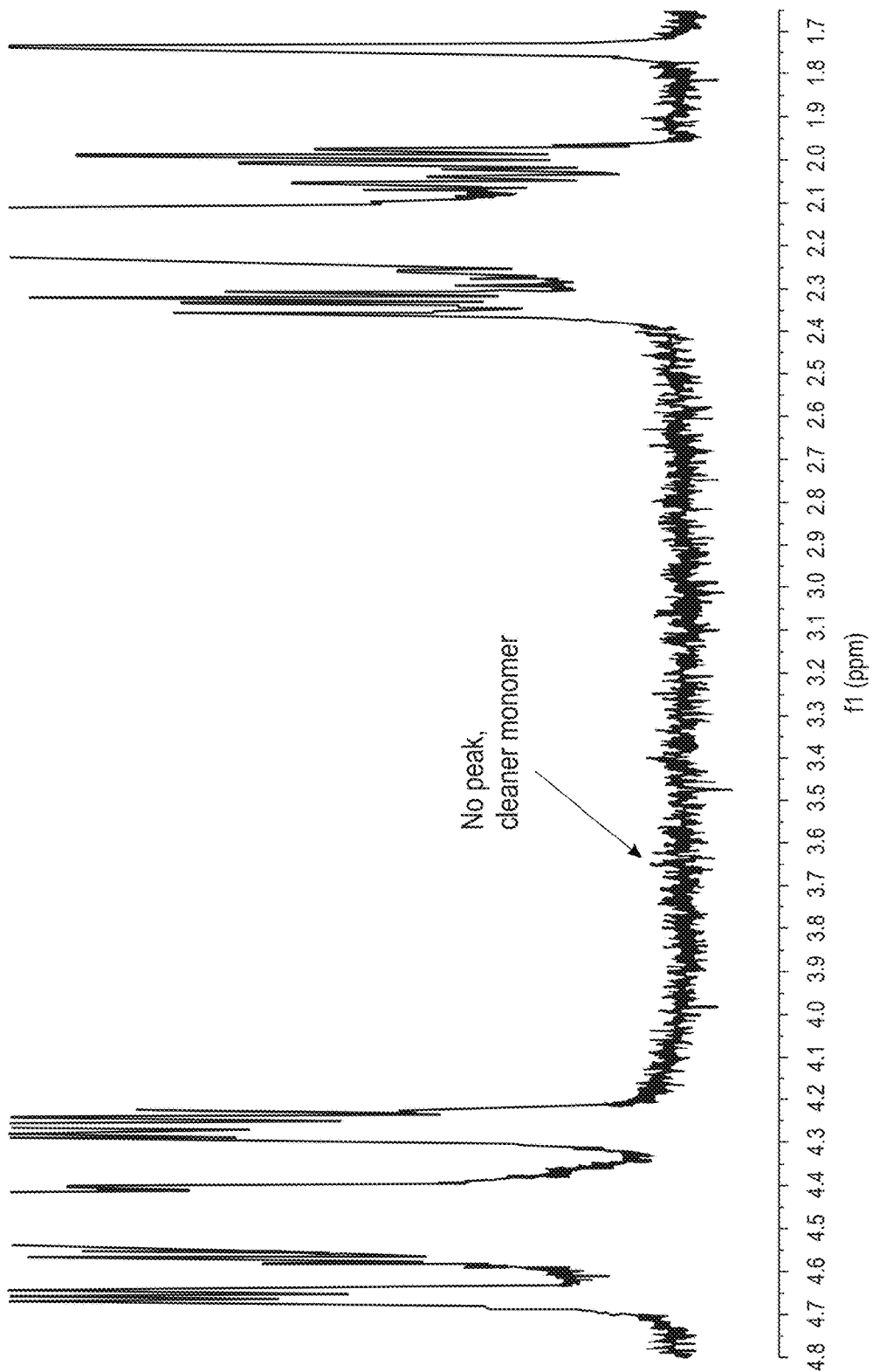
FIG. 7 is a proton NMR spectrum of the TMC after three recrystallization cycles (Example 4).

To a 100 ml round bottom flask equipped with a magnetic stir bar, TMC (10.0 g, 98 mmol) and toluene (10 ml) were added. The reaction mixture was heated in an oil-bath at 40° C. until the TMC completely dissolved in toluene to form a clear mixture. At this point, the heating was stopped and the TMC was allowed to crystallize from toluene. TMC was isolated in a frit funnel by removing the toluene under vacuum. The TMC was dried at room temperature under vacuum for two days. This process was repeated for two more times and the resulting triple crystallized TMC monomer was dried under high vacuum for two days followed by drying in a desiccator equipped with calcium sulfate desiccant. FIG. 7 is a proton NMR spectrum of the TMC after three recrystallization cycles.

Example 5. Synthesis of P-2 Homopolymer Using DPP Catalyst Using TMC from Example 4

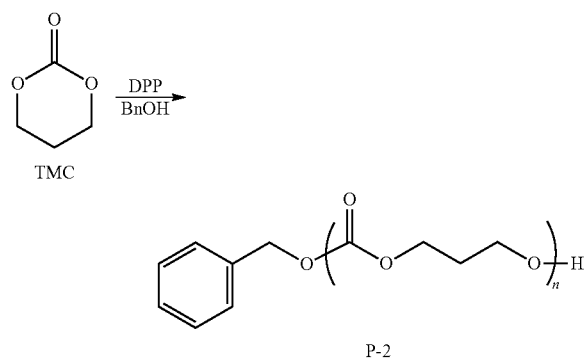

To an oven dried 4 ml glass vial equipped with a magnetic stir bar, TMC (50 mg, 0.49 mmol) from Example 4, benzyl alcohol (0.5 mg, 0.0049 mmol), and DCM (0.12 ml) were added. The reaction mixture was stirred until a TMC was completely dissolved in DCM, upon which DPP (12 mg, 0.049 mmol) was added. The reaction mixture was stirred at room temperature for 3.75 hours in a glove box. The reaction was stopped by bringing the reaction vial out of the glove box and by adding TEA (27 mg, 0.272 mmol) and further stirring the reaction mixture for 45 minutes at room temperature. The polymer P-2 was not isolated. Mn=3.4 k, Mw=3.65 k, PDI=1.06, n=32.

Example 6. Synthesis of P-3 Homopolymer with DPP Catalyst Using TMC from Example 4 without Initiator

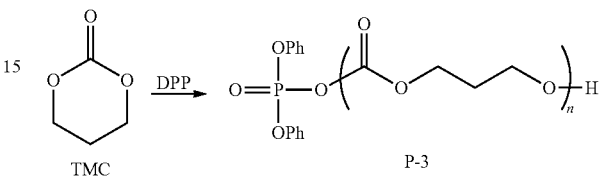

In this instance, it is postulated that DPP acts as both catalyst and initiator for the ring opening polymerization. To an oven dried 4 ml glass vial equipped with a magnetic stir bar, TMC (100 mg, 98 mmol) from Example 4 and DCM (0.24 ml) were added. The reaction mixture was stirred until the TMC was completely dissolved in DCM, upon which DPP (16 mg, 0.064 mmol) was added. The reaction mixture was stirred at room temperature for 22 hours in a glove box. The reaction was stopped by bringing the reaction vial out of the glove box and by adding TEA (27 mg, 0.272 mmol) and further stirring the reaction mixture for 45 minutes at room temperature. The polymer was not isolated. Mn=18.0 k, Mw=21.3 k, PDI=1.18, n=171.

Example 7. Synthesis of P-3 Homopolymer with DPP Catalyst Using TMC from Example 4 without Initiator The structure of P-3 is shown in Example 6. To an oven dried 4 ml glass vial equipped with a magnetic stir bar, TMC (100 mg, 98 mmol) from Example 4 and DCM (0.24 ml) were added. The reaction mixture was stirred until a TMC was completely dissolved in DCM, upon which DPP (8 mg, 0.032 mmol) was added. The reaction mixture was stirred at room temperature for 22 hours in a glove box. The reaction was stopped by bringing the reaction vial out of the glove box and by adding TEA (27 mg, 0.272 mmol) and further stirring the reaction mixture for 45 minutes at room temperature. The polymer was not isolated. Mn=22.4 k, Mw=24.8 k, PDI=1.10, n=213.

Table 7 summarizes the preparations of TMC homopolymers.

TABLE 7

| Example | Monomer | Catalyst | Initiator | Temp | Time (hours) | Polymer | n | Mn | Mw | PDI |
|---|---|---|---|---|---|---|---|---|---|---|
| 1 | TMC | DBU | BnOH | r.t. | 1.4 | P-1 | 62 | 6.5 | 7.2 | 1.1 |
| 2 | TMC | DPP | BnOH | r.t. | 2.5 | P-1 | 28 | 2.98 | 3.1 | 1.06 |
| 5 | TMC-4 | DPP | BnOH | r.t. | 3.75 | P-2 | 32 | 3.4 | 3.65 | 1.06 |
| 6 | TMC-4 | DPP | | r.t. | 22 | P-3 | 171 | 18 | 21.3 | 1.18 |
| 7 | TMC-4 | DPP | | r.t. | 22 | P-3 | 213 | 22.4 | 24.8 | 1.1 |

Synthesis of PS-OH by ATRP

Example 8. Synthesis of Hydroxyl-End Functional Polystyrene, PS-OH, by ATRP, Mn=9.4 k

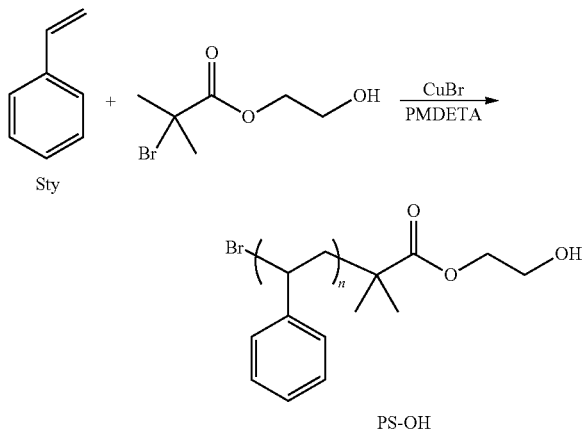

PS-OH

To a 100 ml Schlenk flask equipped with a stir bar, styrene (29.9 g, 0.28 mol), 2-hydroxyethyl 2-bromo-2-methylpropanoate (0.10 g, 0.473 mmol, MW=211, ATRP initiator), and CuBr (68 mg, 0.473 mmol) were added. The flask was sealed with a rubber septum and was purged by bubbling nitrogen for one hour. At this point, PMDETA (82 mg, 0.473 mmol) was added and the reaction flask was placed in an oil-bath set at 110° C. for 75 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. Mn=9.4 k, Mw=10.5 k, PDI=1.12, n=85.

Example 9. Synthesis of PS-OH by ATRP, Mn=5.5 k

The structure of PS-OH is shown in Example 8. To a 100 ml Schlenk flask equipped with a stir bar, styrene (14.80 g, 0.142 mol), 2-hydroxyethyl 2-bromo-2-methylpropanoate (0.20 g, 0.946 mmol, ATRP initiator), CuBr (0.126 g, 0.946 mmol) and anisole (15 g) were added. The flask was sealed with a rubber septum and was purged by bubbling nitrogen for one hour. At this point, PMDETA (0.168 g, 0.946 mmol) was added and the reaction flask was placed in an oil-bath set at 110° C. for 280 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. Mn=5.5 k, Mw=6.0 k, PDI=1.07, n=49.

Example 10. Synthesis of PS-OH by ATRP Mn=6.6 k

The structure of PS-OH is shown in Example 8. To a 100 ml Schlenk flask equipped with a stir bar, styrene (14.80 g, 0.142 mol), 2-hydroxyethyl 2-bromo-2-methylpropanoate (0.20 g, 0.946 mmol, ATRP initiator), CuBr (0.126 g, 0.946 mmol) and anisole (15 g) were added. The flask was sealed with a rubber septum and was purged by bubbling nitrogen for one hour. At this point, PMDETA (0.168 g, 0.946 mmol) was added and the reaction flask was placed in an oil-bath set at 110° C. for 310 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. Mn=6.5 k, Mw=7.0 k, PDI=1.07, n=58.

Table 8 summarizes the preparations of PS-OH by ATRP.

TABLE 8

| Example | Monomer | Catalyst | Initiator | Temp | Time (hours) | Polymer | n | Mn | Mw | PDI |
|---|---|---|---|---|---|---|---|---|---|---|
| 8 | Styrene | CuBr/PMDETA | HEBMP | 110 | 1.25 | PS—OH | 85 | 9.4 | 10.5 | 1.12 |
| 9 | Styrene | CuBr/PMDETA | HEBMP | 110 | 4.7 | PS—OH | 49 | 5.5 | 6 | 1.07 |
| 10 | Styrene | CuBr/PMDETA | HEBMP | 110 | 5.2 | PS—OH | 58 | 6.5 | 6 | 1.07 |

Synthesis of Polystyrene-b-Polycarbonate Block Copolymers

Examples 11-16 form block copolymer PS-b-PTMC by the following reaction scheme.

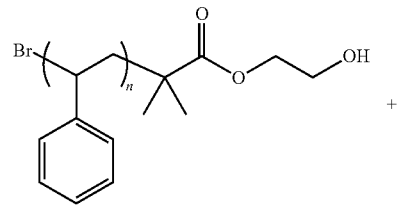

+

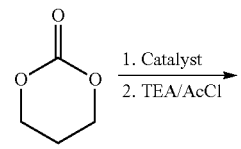

1. Catalyst
2. TEA/AcCl

-continued

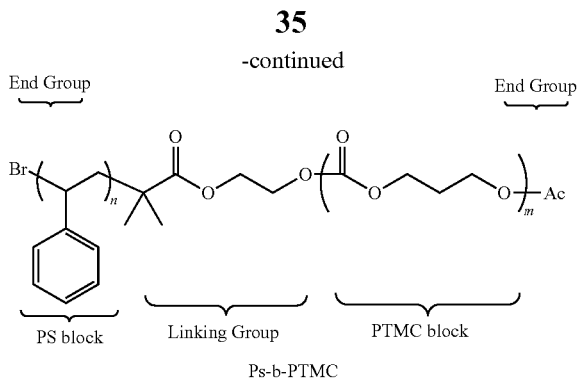

Ps-b-PTMC

In the following examples PS refers to polystyrene block and PTMC refers to poly(trimethylene carbonate) block in the formula PS-b-PTMC. The number average molecular weight of each block is shown in parentheses (e.g., in PS(5.5 k)-b-PTMC(4.8 k), the PS block has an Mn=5500 (n=51), and the PTMC block has an Mn=4800 (m=46).

Example 11. Synthesis of PS-b-PTMC with DBU Catalyst

To an oven dried 4 ml glass vial equipped with a magnetic stir bar, PS-OH (0.15 g, 0.0272 mmol, initiator, from Example 9), TMC (0.152 g, 1.49 mmol, from Example 4), and DCM (0.37 ml) were added. The reaction mixture was stirred until the PS-OH macroinitiator and TMC were completely dissolved in DCM, upon which DBU (12 mg, 0.078 mmol) was added. The reaction mixture was stirred at room temperature for 150 minutes in a glove box. The reaction was stopped by bringing the reaction vial out of the glove box and by adding DCM (1 ml), TEA (0.27 g, 02.72 mmol) and acetyl chloride (about 21 mg, 0.272 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=13.1 k, Mw=14.3 k, PDI=1.09; Mn (NMR)=PS(5.5 k)-b-PTMC(4.8 k), n=51, m=46; TMC % conversion: about 86%.

Example 12. Synthesis of PS-b-PTMC with DBU Catalyst

Figure 8:
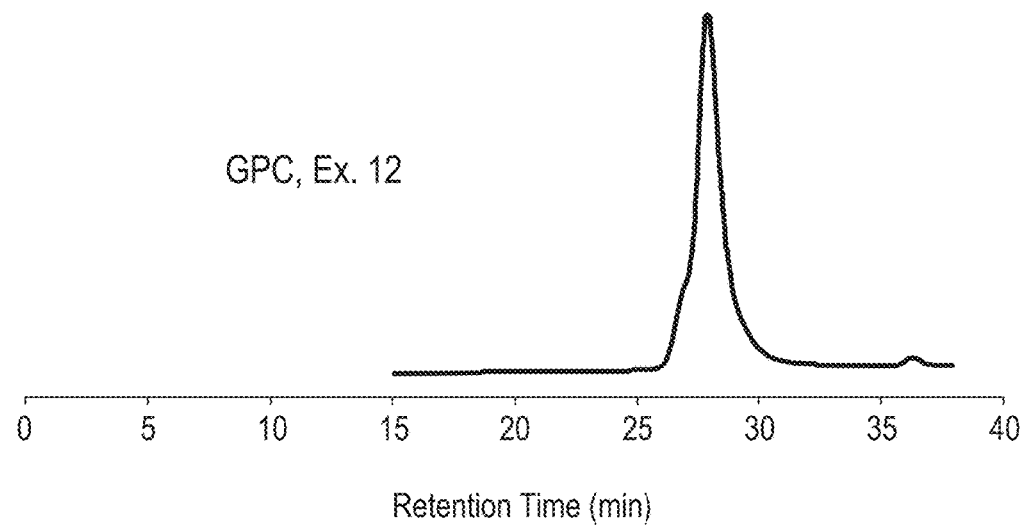
FIG. 8 is a GPC trace of the block polymer of Example 12 before fractionation, in which TMC conversion was 99%.

To an oven dried 4 ml glass vial equipped with a magnetic stir bar, PS-OH (0.5 g, 0.077 mmol, from Example 10), TMC (0.35 g, 3.43 mmol, from Example 3), and DCM (0.75 ml) were added. The reaction mixture was stirred until the PS-OH macroinitiator and TMC were completely dissolved in DCM, upon which DBU (58 mg, 0.376 mmol) was added. The reaction mixture was stirred at room temperature for four hours in a glove box. The reaction was stopped by bringing the reaction vial out of the glove box and by adding acetyl chloride (about 32 mg, 0.4 mmol) and TEA (10 mg, 0.1 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=13.5 k, Mw=15.6 k, PDI=1.15; Mn (NMR)=PS(6.5 k)-b-PTMC(4.5 k), n=60, m=43; TMC % conversion was about 98%. FIG. 8 is GPC trace of this sample.

Example 13. Synthesis of PS-b-PTMC with DPP Catalyst

Figure 9:
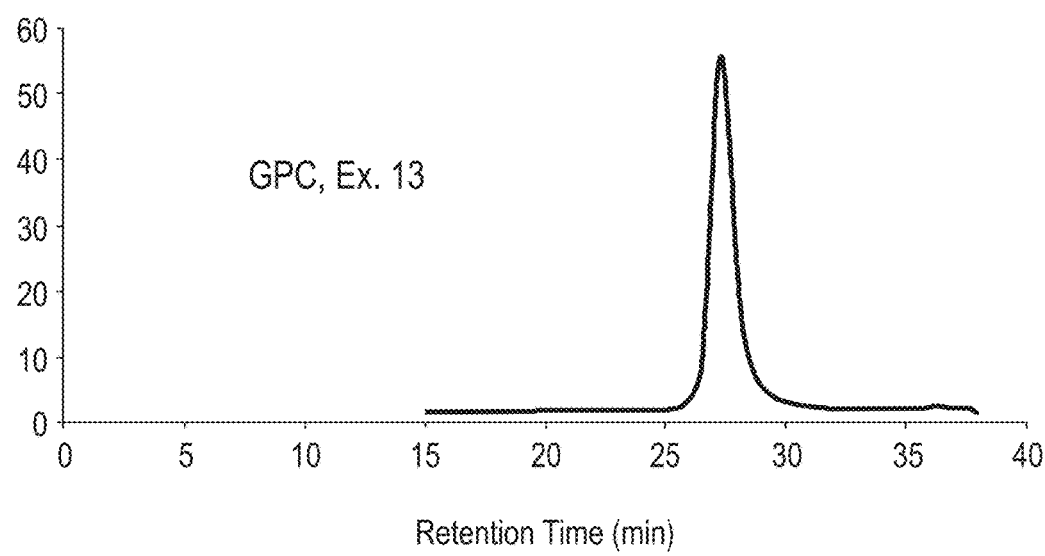
FIG. 9 is a GPC trace of the block polymer of Example 13 before fractionation, in which TMC conversion was 94%.

To an oven dried 4 ml glass vial equipped with a magnetic stir bar, PS-OH (40 mg, 0.004 mmol, from Example 8), TMC (51 mg, 0.5 mmol, from Example 3), and DCM (0.12 ml) were added. The reaction mixture was stirred until the PS-OH macroinitiator and TMC were completely dissolved in DCM, upon which DPP (10 mg, 0.04 mmol) was added. The reaction mixture was stirred at room temperature for 15 hours in a glove box. The reaction was stopped by bringing the reaction vial out of the glove box and by adding DCM (0.3 ml), TEA (40 mg, 0.4 mmol), and acetyl chloride (about 10 mg, 0.128 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=17.9 k, Mw=20.1 k, PDI=1.12; Mn (NMR)=PS(9.4 k)-b-PTMC(11.5 k), n=87, m=112; TMC % conversion: about 94%. FIG. 9 is GPC trace of this sample.

Example 14. Synthesis of PS-b-PTMC with DPP Catalyst

To an oven dried 4 ml glass vial equipped with a magnetic stir bar, PS-OH (0.15 g, 0.0272 mmol, from Example 9), TMC (0.138 g, 1.36 mmol, from Example 4), and DCM (0.34 ml) were added. The reaction mixture was stirred until the PS-OH macroinitiator and TMC were completely dissolved in DCM, upon which DPP (68 mg, 0.272 mmol) was added. The reaction mixture was stirred at room temperature for 20 hours in a glove box. The reaction was stopped by bringing the reaction vial out of the glove box and by adding DCM (1 ml), TEA (0.27 g, 02.72 mmol) and acetyl chloride (about 21 mg, 0.272 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=11.9 k, Mw=12.9 k, PDI=1.07; Mn (NMR)=PS(5.5 k)-b-PTMC(5.4 k), n=51, m=52; TMC % conversion: >99%.

Example 15. Synthesis of PS-b-PTMC with DPP Catalyst

To an oven dried 4 ml glass vial equipped with a magnetic stir bar, PS-OH (0.15 g, 0.0272 mmol, from Example 9), TMC (0.167 g, 1.68 mmol, from Example 4), and DCM (0.40 ml) were added. The reaction mixture was stirred until the PS-OH macroinitiator and TMC were completely dissolved in DCM, upon which 68 mg (0.272 mmol) of DPP was added. The reaction mixture was stirred at room temperature for 20 hours in a glove box. The reaction was stopped by bringing the reaction vial out of the glove box and by adding 1 ml of DCM, 0.27 g (02.72 mmol) of TEA and ~21 mg (0.272 mmol) of acetyl chloride. The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)= 16.1 k, Mw=17.5 k, PDI=1.08. Mn (NMR)=PS(5.5 k)-b-PTMC(6.3 k), n=51, m=62; TMC % conversion >99%

Example 16. Synthesis of PS-b-PTMC with DPP Catalyst

To an oven dried 4 ml glass vial equipped with a magnetic stir bar, PS-OH (0.15 g, 0.0272 mmol, from Example 9), TMC (0.194 g, 1.90 mmol, from Example 4), and DCM (0.47 ml) were added. The reaction mixture was stirred until the PS-OH macroinitiator and TMC were completely dissolved in DCM, upon which DPP (68 mg, 0.272 mmol) was added. The reaction mixture was stirred at room temperature for 20 hours in a glove box. The reaction was stopped by bringing the reaction vial out of the glove box and by adding DCM (1 ml), TEA (0.27 g, 02.72 mmol) and acetyl chloride (about 21 mg, 0.272 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=18.5 k, Mw=20.0 k, PDI=1.08; Mn (NMR)=PS(5.5 k)-b-PTMC(7.7 k), n=51, m=75; TMC % conversion: >99%.

Examples 17-22 form block copolymer by the following reaction scheme using a polystyrene macroinitiator AZ-PS-OH purchased from AZ Electronic Materials. The block copolymers are referred to by the name AZPS-b-PTMC block copolymers.

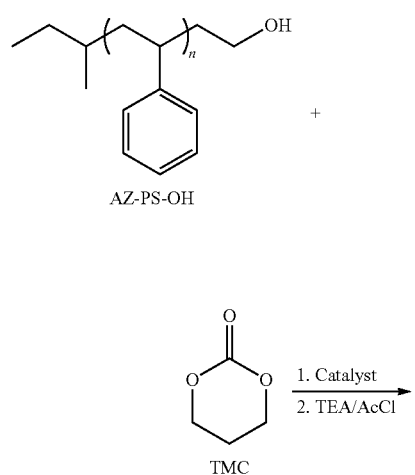

AZ-PS-OH

TMC

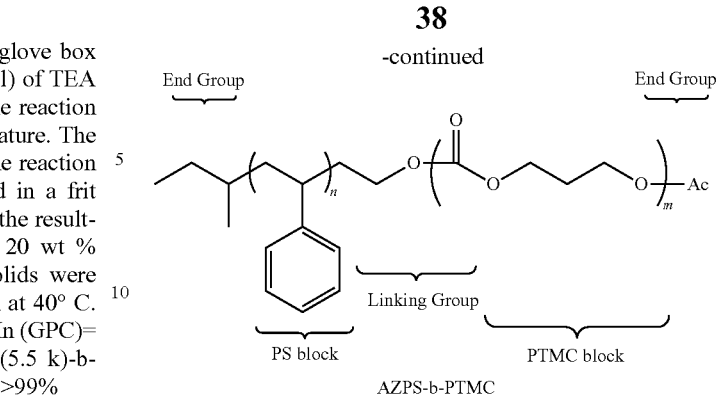

AZPS-b-PTMC

Example 17. Synthesis of AZPS-b-PTMC with DPP Catalyst

To an oven dried 25 ml round bottom flask equipped with a magnetic stir bar, AZ-PS-OH (1.00 g, 0.161 mmol, Mn=6200, PDI=1.02, obtained from AZ-Electronic Materials, Branchburg, N.J.), TMC (1.217 g, 11.93 mmol, from Example 4), and DCM (2.94 ml) were added. The reaction mixture was stirred until the AZ-PS-OH macroinitiator and TMC were completely dissolved in DCM, upon which DPP (800 mg, 3.2 mmol) was added. The reaction mixture was stirred at room temperature for 16 hours in a glove box. The reaction flask was brought out of the glove box and cooled at 0° C. by immersing it in an ice-water bath. The reaction was stopped by adding DCM (6 ml), TEA (0.7 ml, 02.72 mmol) and acetyl chloride (0.25 ml, 3.52 mmol). The reaction was further stirred for two hours at room temperature. The resulting polymer was isolated by precipitating the reaction mixture in methanol. The product was collected in a fit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)= 13.3 k, Mw=13.7 k, PDI=1.029; Mn (NMR)=AZPS(6.2 k)-b-PTMC(7.7 k), n=57, m=75; TMC % conversion: >99%.

Example 18. Synthesis of AZPS-b-PTMC with DPP Catalyst

To an oven dried 25 ml round bottom flask equipped with a magnetic stir bar, AZ-PS-OH (1.00 g, 0.161 mmol, Mn=6200, PDI=1.02, obtained from AZ-Electronic Materials, Branchburg, N.J.), TMC (1.217 g, 11.93 mmol, from Example 4), and DCM (2.94 ml) were added. The reaction mixture was stirred until the AZ-PS-OH macroinitiator and TMC were completely dissolved in DCM, upon which DPP (400 mg, 1.6 mmol) was added. The reaction mixture was stirred at room temperature for 16 hours in a glove box. The reaction flask was brought out of the glove box and cooled at 0° C. by immersing it in an ice-water bath. The reaction was stopped by adding DCM (6 ml), TEA (0.7 ml, 02.72 mmol) and of acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C.

for two hours to obtain the resulting compound. Mn (GPC) =14.1 k, Mw=14.5 k, PDI=1.029; Mn (NMR)=AZPS(6.2 k)-b-PTMC(7.7 k), n=57, m=75; TMC % conversion >99%.

Example 19. Synthesis of AZPS-b-PTMC with DPP Catalyst

To an oven dried 4 ml glass vial equipped with a magnetic stir bar, AZ-PS-OH (0.2 g, 0.0322 mmol, Mn=6200, PDI=1.02, obtained from AZ-Electronic Materials, Branchburg, N.J.), TMC (0.242 g, 2.37 mmol, from Example 4), and DCM (0.6 ml) were added. The reaction mixture was stirred until the AZ-PS-OH macroinitiator and TMC were completely dissolved in DCM, upon which DPP (80 mg, 0.32 mmol) was added. The reaction mixture was stirred at room temperature for 12 hours in a glove box. Kinetics of TMC ring opening was monitored by taking aliquots every two hours. The polymer was not isolated.

Example 20. Synthesis of AZPS-b-PTMC with DPP Catalyst

Figure 10:
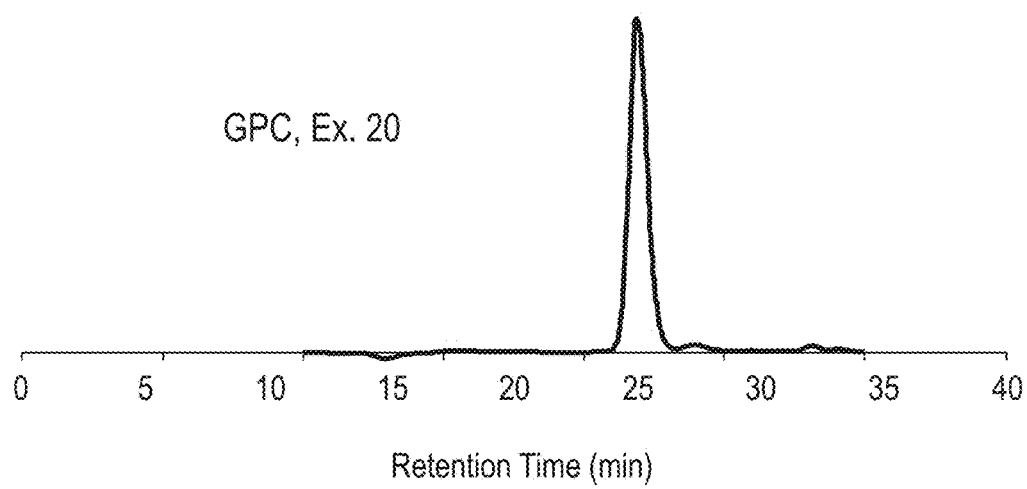
FIG. 10 is a GPC trace of the block polymer of Example 20 before fractionation, in which TMC conversion was 50%.

To an oven dried 20 ml round bottom flask equipped with a magnetic stir bar, AZ-PS-OH (0.70 g, 0.113 mmol, Mn=6200, PDI=1.02, obtained from AZ-Electronic Materials, Branchburg, N.J.), TMC (1.76 g, 17.25 mmol, from Example 4), and DCM (2.94 ml) were added. The reaction mixture was stirred until the AZ-PS-OH macroinitiator and TMC were completely dissolved in DCM, upon which DPP (400 mg, 1.6 mmol) was added. The reaction mixture was stirred at room temperature for 16 hours in a glove box. The reaction flask was brought out of the glove box and cooled at 0° C. by immersing it in an ice-water bath. The reaction was stopped by adding DCM (6 ml), TEA (0.7 ml, 02.72 mmol) and acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. Mn (GPC)= 14.1 k, Mw=14.5 k, PDI=1.029; Mn (NMR)=AZPS(6.2 k)-PMTC(7.7 k), n=57.4, m=75; TMC % conversion: about 50%. FIG. 10 is a graph of the GPC trace.

Example 21. Synthesis of AZPS-b-PTMC with DPP Catalyst

To an oven dried 4 ml glass vial equipped with a magnetic stir bar, AZ-PS-OH (0.25 g, 0.040 mmol, Mn=6200, PDI=1.02, obtained from AZ-Electronic Materials, Branchburg, N.J.), TMC (0.271 g, 2.66 mmol, from Example 4), and DCM (0.67 ml) were added. The reaction mixture was stirred until the AZ-PS-OH macroinitiator and TMC were completely dissolved in DCM, upon which DPP (100 mg, 0.4 mmol) was added. The reaction mixture was stirred at room temperature for 5 hours in a glove box. The reaction was stopped by bringing the reaction vial out of the glove box and by adding DCM (1 ml), TEA (0.27 g, 2.72 mmol) and acetyl chloride (about 21 mg, 0.272 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)= 10.5 k, Mw=10.8 k, PDI=1.03; Mn (NMR)=AZPS(6.2 k)-PTMC(3.0 k), n=57, m=29; TMC % conversion: about 50%.

Example 22. Synthesis of AZPS-b-PTMC with DPP Catalyst

To an oven dried 4 ml glass vial equipped with a magnetic stir bar, AZ-PS-OH (0.20 g, 0.02 mmol, Mn=10000, PDI=1.04, obtained from AZ-Electronic Materials, Branchburg, N.J.), TMC (0.518 g, 5.08 mmol, from Example 4), and DCM (1.27 ml) were added. The reaction mixture was stirred until the AZ-PS-OH macroinitiator and TMC were completely dissolved in DCM, upon which DPP (63 mg, 0.252 mmol) was added. The reaction mixture was stirred at room temperature for 21 hours in a glove box. The reaction was stopped by bringing the reaction vial out of the glove box and by adding DCM (1.5 ml), TEA (0.27 g, 2.72 mmol) and acetyl chloride (about 21 mg, 0.272 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)= 25 k, Mw=26 k, PDI=1.04; Mn (NMR)=AZPS(10 k)-PTMC (13.0 k), n=92, m=127; TMC % conversion: about 53%.

Fractionation of Block Copolymers

Example 23. Fractionation of PS-b-PTMC Obtained from Example 12

Figure 11:
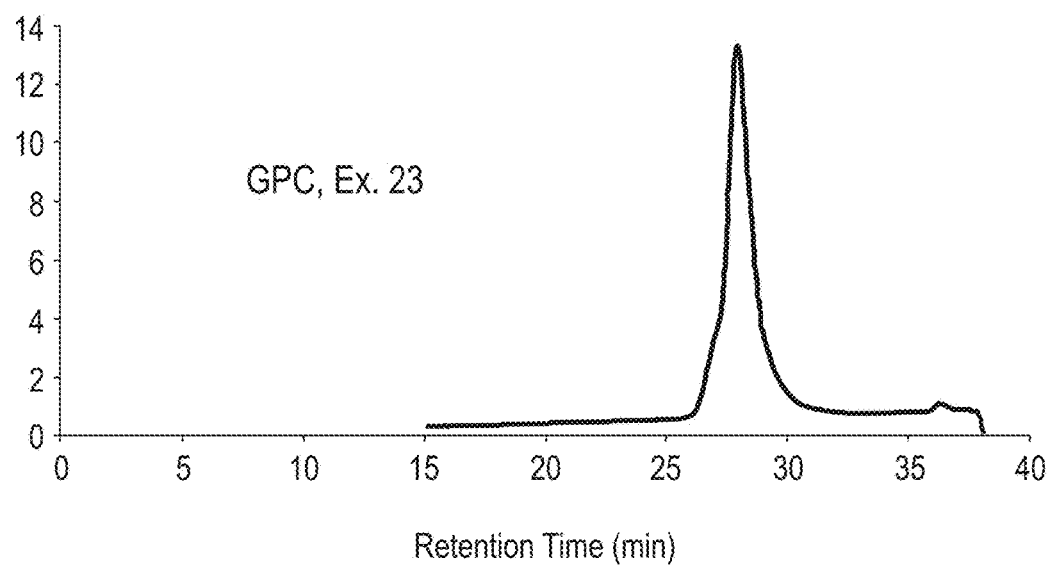
FIG. 11 is a GPC trace of Example 23 after fractionating the block polymer of Example 12 using methanol:acetonitrile 80:20 v/v.

PS-b-PTMC (30 mg) from Example 12 was dissolved in THF to form a 20 wt % solution and the polymer was precipitated in methanol:acetonitrile (10 ml, 80:20 volume ratio (v/v)). The precipitated solids and the solvents were collected in a centrifuge tube and the solids was collected by centrifuging at 4000 RPM at 0° C. followed by decanting the solvent and drying the solid in a vacuum oven at 40° C. for two hours. Mn (GPC)=13.2 k, Mw=15.2 k, PDI=1.15; Mn (NMR)=PS(6.5 k)-b-PTMC(4.4 k). FIG. 11 is a GPC trace of this sample (compare with FIG. 8).

Example 24. Fractionation of PS-b-PTMC Obtained from Example 12

Figure 12:
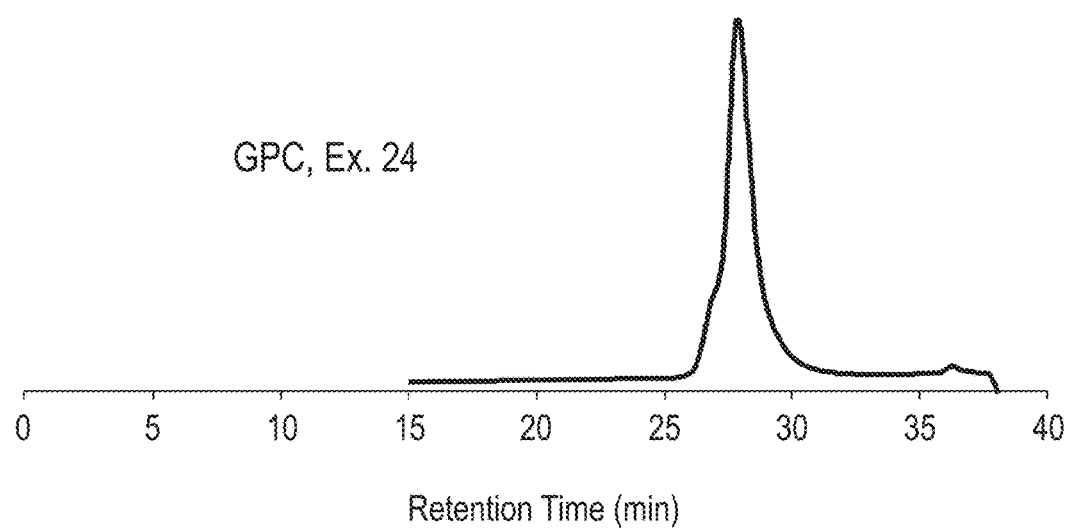
FIG. 12 is a GPC trace of Example 24 after fractionating the block polymer of Example 12 using methanol:acetonitrile 60:40 v/v.

PS-b-PTMC (30 mg) from Example 12 was dissolved in THF to form a 20 wt % solution and the polymer was precipitated in methanol:acetonitrile (10 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=13.2 k, Mw=15.4 k, PDI=1.16; Mn (NMR)=PS (6.5 k)-b-PTMC(4.0 k), n=60, m=39. FIG. 12 is a GPC trace of this sample (compare with FIG. 8).

Example 25. Fractionation of PS-b-PTMC Obtained from Example 12

Figure 13:
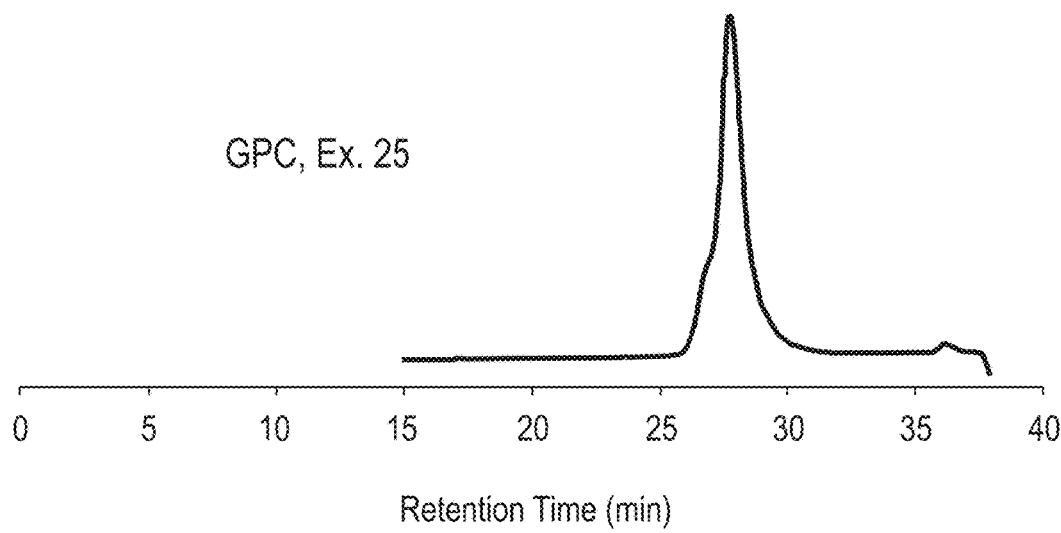
FIG. 13 is a GPC trace of Example 25 after fractionating the block polymer of Example 12 using methanol:acetonitrile 40:60 v/v.

PS-b-PTMC (30 mg) from Example 12 was dissolved in THF to form a 20 wt % solution and the polymer was precipitated in methanol:acetonitrile (10 ml, 40:60 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=14.2 k, Mw=16.3 k, PDI=1.14. Mn (NMR)=PS (6.5 k)-b-PTMC(3.6 k), n=60, m=35. FIG. 13 is a GPC trace of this sample (compare with FIG. 8).

Example 26. Fractionation of PS-b-PTMC Obtained from Example 13

Figure 14:
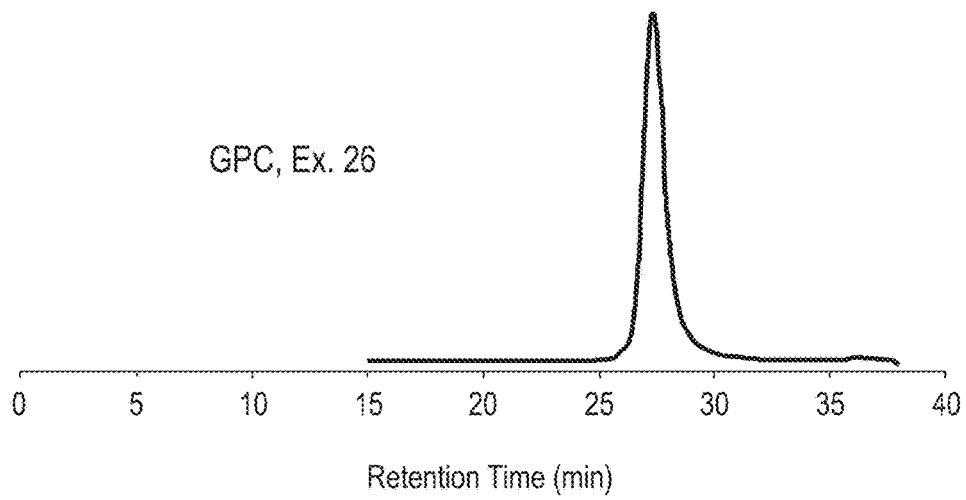
FIG. 14 is a GPC trace of Example 26 after fractionating the block polymer of Example 13 using methanol:acetonitrile 40:60 v/v.

PS-b-PTMC (30 mg) from Example 13 was dissolved in THF to form a 20 wt % solution and the polymer was precipitated in methanol:acetonitrile (10 ml, 40:60 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=18.5 k, Mw=20.0 k, PDI=1.08; Mn (NMR)=PS (9.4 k)-b-PTMC(4.4 k), n=87, m=43. FIG. 14 is a GPC trace of this sample.

Example 27. Evaluation of Decanted Solvent from Example 26

Decanted solvent from Example 26 was evaporated under vacuum and the resulting solids were evaluated by GPC and NMR. Mn (GPC)=15.0 k, Mw=15.8K, PDI=1.05; molar ratio of Styrene:TMC by NMR=1:22.7.

Example 28. Fractionation of PS-b-PTMC Obtained from Example 14

PS-b-PTMC (0.2 g) from Example 14 was dissolved in THF to form a 20 wt % solution and the polymer was precipitated in methanol:acetonitrile (200 ml, 40:60 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=11.2 k, Mw=12.1 k, PDI=1.08; Mn (NMR)=PS (5.5 k)-b-PTMC(4.5 k), n=51, m=44.

Example 29. Fractionation of PS-b-PTMC Obtained from Example 15

PS-b-PTMC (0.2 g) from Example 15 was dissolved in THF to form a 20 wt % solution and the polymer was precipitated in methanol:acetonitrile (200 ml, 40:60 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=14.8 k, Mw=16.1 k, PDI=1.08; Mn (NMR)=PS (5.5 k)-b-PTMC(5.3 k), n=51, m=52.

Example 30. Fractionation of PS-b-PTMC Obtained from Example 16

PS-b-PTMC (0.2 g) from Example 16 was dissolved in THF to form a 20 wt % solution and the polymer was precipitated in methanol:acetonitrile (200 ml, 40:60 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=17.8 k, Mw=19.3 k, PDI=1.08. Mn (NMR)=PS (5.5 k)-b-PTMC(6.5 k), n=51, m=64.

Example 31. Fractionation of AZPS-b-PTMC Obtained from Example 17

AZPS-b-PTMC (0.3 g) from Example 17) was dissolved in THF to form a 20 wt % solution and the polymer was precipitated in methanol:acetonitrile (300 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=13.5 k, Mw=13.9 k, PDI=1.02; Mn (NMR)= AZPS(6.2 k)-b-PTMC(5.8 k), n=57, m=57.

Example 32. Fractionation of AZPS-b-PTMC Obtained from Example 18

AZPS-b-PTMC (0.2 g) from Example 18 was dissolved in THF to form a 20 wt % solution and the polymer was precipitated in methanol:acetonitrile (200 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=14.0 k, Mw=14.4 k, PDI=1.03; Mn (NMR)= AZPS(6.2 k)-b-PTMC(6.4 k), n=57, m=63.

Example 33. Fractionation of AZPS-b-PTMC Obtained from Example 20

Figure 15:
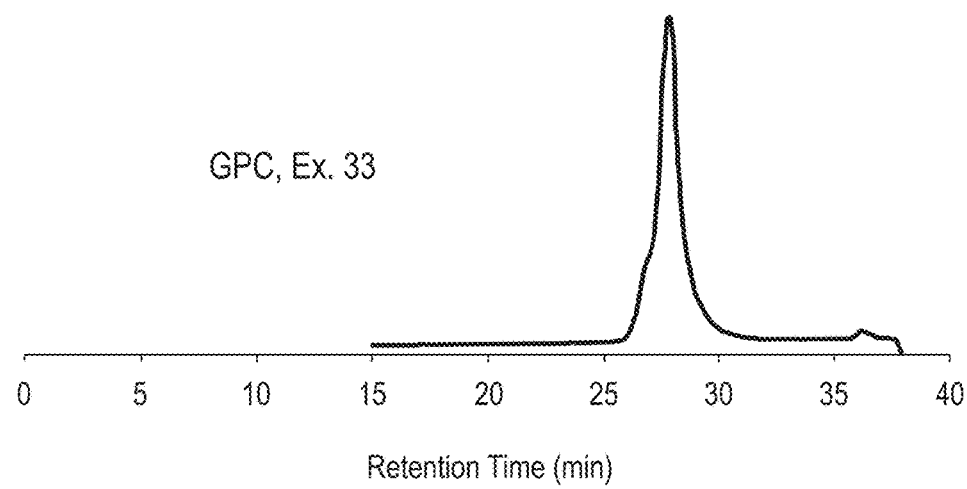
FIG. 15 is a GPC trace of Example 33 after fractionating the block polymer of Example 20 using methanol:acetonitrile 60:40 v/v.

AZPS-b-PTMC (0.2 g) from Example 20 was dissolved in THF to form a 20 wt % solution and the polymer was precipitated in methanol:acetonitrile (200 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=17.2 k, Mw=17.6 k, PDI=1.02; Mn (NMR)= AZPS(6.2 k)-b-PTMC(7.7 k), n=57, m=75. FIG. 15 is a GPC trace of this sample (compare with FIG. 10)

Example 34. Fractionation of AZPS-b-PTMC Obtained from Example 21

AZPS-b-PTMC (0.2 g) from Example 21 was dissolved in THF to form a 20 wt % solution and the polymer was precipitated in methanol:acetonitrile (200 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=10.9 k, Mw=11.3 k, PDI=1.03; Mn (NMR)= AZPS(6.2 k)-b-PTMC(2.9 k), n=57, m=28.

Example 35. Fractionation of AZPS-b-PTMC Obtained from Example 22

AZPS-b-PTMC (0.2 g) from Example 22 was dissolved in THF to form a 20 wt % solution and the polymer was precipitated in methanol:acetonitrile (200 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours.

Mn (GPC)=22.1 k, Mw=24.2 k, PDI=1.09; Mn (NMR)= AZPS(10 k)-b-PTMC(13.3 k), n=93, m=130.
Formation of AZPS-b-PMTC-Me Block Copolymer

Example 36. Synthesis of AZPS-b-PMTC-Me

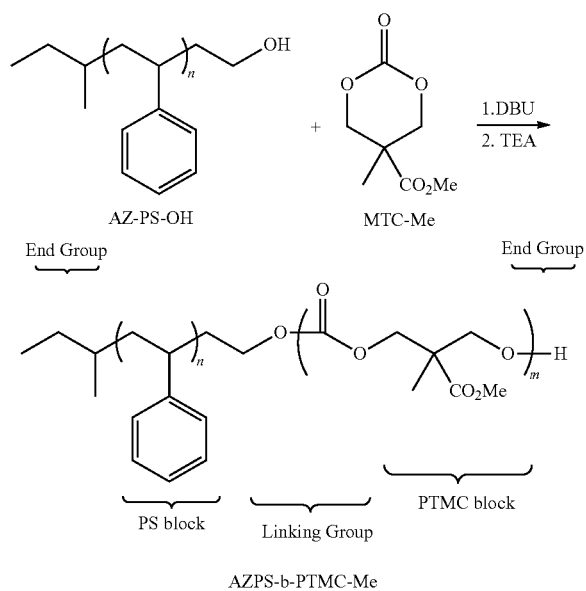

To an oven dried 4 ml glass vial equipped with a magnetic stir bar, AZ-PS-OH (0.2 g, 0.0322 mmol, Mn=6200, PDI=1.02, obtained from AZ-Electronic Materials, Branchburg, N.J.), MTC-Me (0.21 g, 1.20 mmol), and DCM (0.6 ml) were added. The reaction mixture was stirred until the AZ-PS-OH macroinitiator and TMC were completely dissolved in DCM, upon which DBU (15 mg, 0.097 mmol) was added. The reaction mixture was stirred at room temperature for one hour in a glove box. The resulting non-endcapped block polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)= 15.5 k, Mw=16.8 k, PDI=1.08; Mn (NMR)=AZPS(6.2 k)-b-PMTC-Me(5.9 k), n=57, m=58; MTC-Me % conversion: >99%.

Example 37. Fractionation of AZPS-b-PMTC-Me Obtained from Example 36

AZPS-b-PMTC-Me (0.15 g), from Example 36 was dissolved in THF to form a 20 wt % solution and the polymer was precipitated in methanol:acetonitrile (150 ml, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=14.4 k, Mw=15.9 k, PDI=1.10; Mn (NMR)=AZPS(6.2 k)-b-PMTC-Me(5.3 k), n=57, m=52.

Example 38. Synthesis of Underlayer

To a 100 ml round bottom flask equipped with a magnetic stir bar and an overhead condenser, styrene (Sty, 5.2 g, 49.9 mmol), acrylonitrile (ACN, 1.22 g, 23.0 mmol), glycidyl methacrylate (GMA, 0.545 g, 3.84 mmol), AIBN (0.25 g, 1.53 mmol) and THF (20 g) were added. The reaction mixture was purged with nitrogen for 15 minutes and was placed in a preheated oil-bath set at 70° C. for 16 hours. The reaction was cooled to room temperature and the polymer was precipitated in hexanes. The product was collected in a frit funnel by removing hexanes under vacuum and the resulting solids were redissolved in THF to form a 20 wt % solution and reprecipitated in hexanes. The solids were collected in a frit funnel and dried under vacuum at 40° C. for 24 hours to obtain the resulting underlayer material. Mn (GPC)=10.6 k, Mw=18.0 k, PDI=1.69. The composition of the copolymer was determined by $^{13}C$ inverse gated NMR (400 MHz in $CDCl_3$). Product mole ratio of Sty:ACN: GMA=0.60:0.34:0.06.

Example 39. Preparation of Underlayer Coated Substrate

A solution of underlayer material from Example 38 was prepared by dissolving the random copolymer and p-NBT (p nitro benzylsulphonic acid, triflate salt) in a weight ratio of 95/5 (w/w) at a concentration of 0.5 wt % in propylene glycol monomethyl ether acetate (PGMEA). p-NBT as a thermal acid generator was added to promote the crosslinking of the copolymer when it was baked in the form of thin film. This resulting solution was passed though a 0.2 micrometer PTFE filter and spin casted on a silicon wafer at 2000 rpm spin rate. After the thin film was formed, the wafer was baked at 215° C. for 2 minutes and cooled to room temperature. A solvent rinse was then conducted by casting PGMEA on top of the wafer and letting the PGMEA puddle for 30 seconds prior to spin drying at 2000 rpm for 30 seconds. The rinse was intended to remove any excess underlayer material that was not crosslinked.

Example 40. Thin Film Preparation and Characterization of as-Cast and Thermal-Annealed PS-b-PTMC of Example 13

Figure 16:
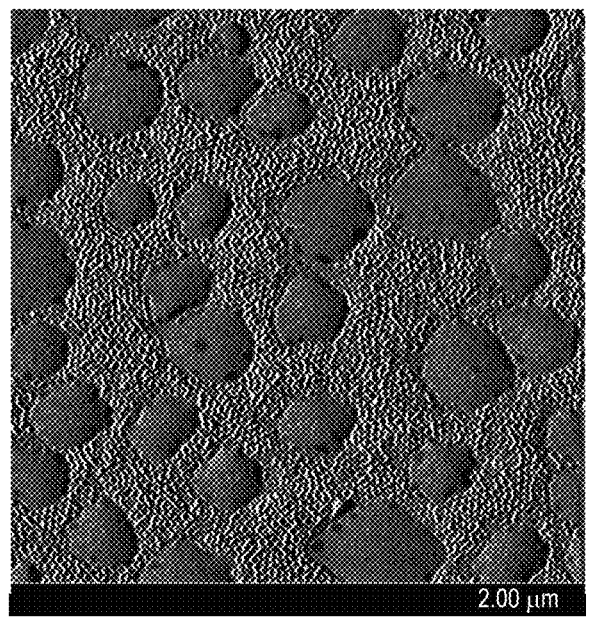
FIG. 16 is an AFM height image of the as-cast film prepared in Example 40 using block polymer PS-b-PTMC from Example 13 (not-fractionated).
Figure 17:
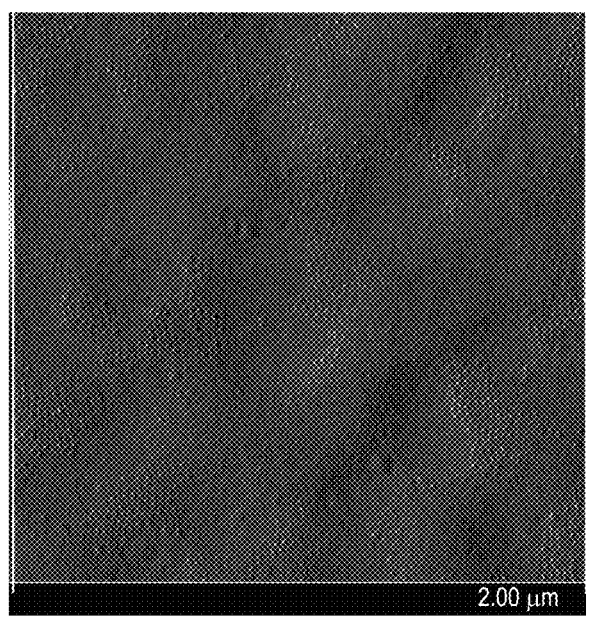
FIG. 17 is an AFM height image of an annealed film prepared in Example 40 using PS-b-PTMC from Example 13.

A solution of PS-b-PTMC obtained from Example 13 was prepared by dissolving the PS-b-PTMC in PGMEA (1% w/w). The solution was filtered using a 0.2 micrometer PTFE filter prior to spin coating the solution onto the underlayer coated silicon wafer of Example 39 at 2000 rpm. The as-cast thin film was characterized by atomic force microscopy (AFM, FIG. 16). The as-cast film was baked at 170° C. for 5 minutes and cooled to room temperature to form a thermally annealed film, which was also characterized by AFM (FIG. 17). AFM characterization was performed with a Digital Instruments 3100 AFM with a 1 N/m spring constant silicon nitride cantilever operated in a tapping mode. Scan size and speed were set at 2 micrometer×2 micrometer area and 2.5 Hz, respectively. PSD (power spectra density) data that gave insight into the periodical spacing between micro-phase separated structures was processed by the Digital Instruments software, Nanoscope version 5.30. The characterized AFM height images of PS-b-PTMC from Example 13 revealed non-uniform surfaces for both as-cast and thermally annealed samples, with no features on the protuberant/uneven area and micro-phase separated cylinder structures on the flat area. The PSD of the as-cast and annealed samples were 22 nm and 23.5 nm, respectively. The PSD numbers indicated the average spacing of the mixture of parallel-oriented and perpendicular-oriented cylinder structures.

Example 41. Thin Film Preparation and Characterization of as-Cast and Thermally Annealed Fractionated PS-b-PTMC of Example 26 Using the Procedure of Example 40 with the PS-b-PTMC of Example 26

Figure 18:
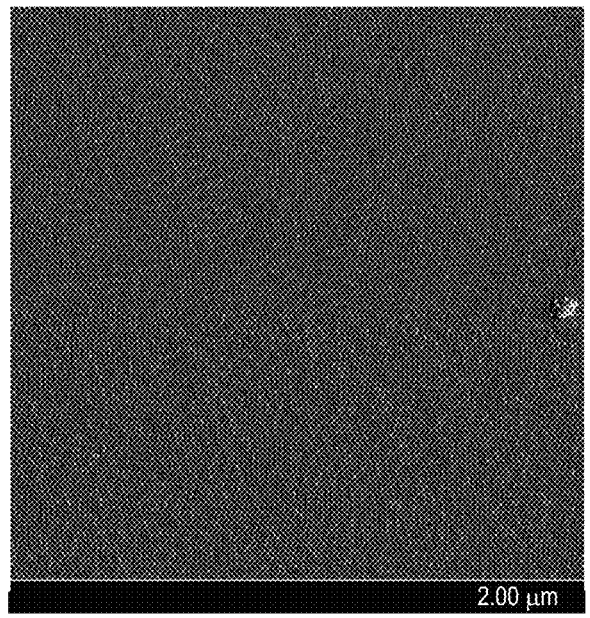
FIG. 18 is an AFM height image of the as-cast film prepared in Example 41 using PS-b-PTMC from Example 26.
Figure 19:
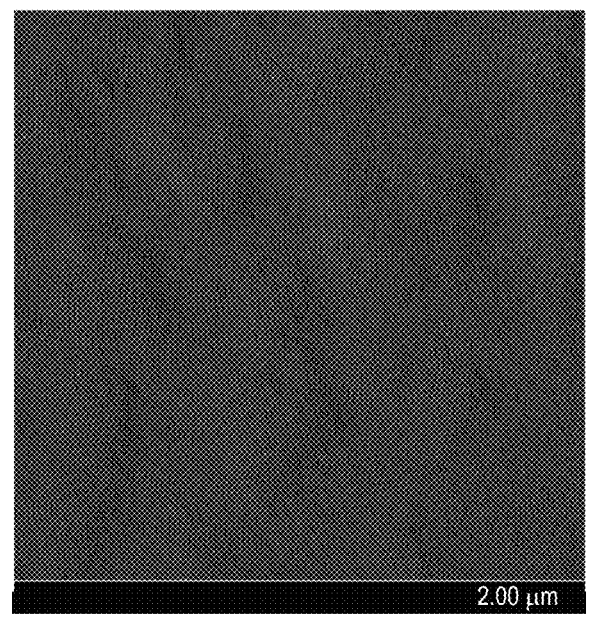
FIG. 19 is an AFM height image of an annealed film prepared in Example 41 using PS-b-PTMC from Example 26.

The characterized films of PS-b-PTMC BCP from Example 26 revealed uniform surfaces of micro-phase separated cylinder structures for both as-cast and annealed films. The as-cast film (FIG. 18) fully consisted of perpendicular-oriented cylinder structures with a row-to-row spacing of 16.5 nm as indicated by the PSD analysis. The annealed film (FIG. 19) revealed more of a mixture of parallel-oriented and perpendicular-oriented cylinder structures that gave rise to the PSD number of 19.5 nm. The higher PSD number indicated the center-to-center spacing between perpendicular-oriented cylinders instead of the row-to-row spacing. The center-to-center spacing number (19.5 nm), however, correlated well with the row-to-row spacing calculation for the hexagonal arrays of perpendicular-oriented cylinders (16.5 nm).

Example 42. Synthesis of AZPS-b-PTMC with DBU Catalyst

To an oven dried 4 ml glass vial equipped with a magnetic stir bar, AZ-PS-OH (0.20 g, 0.0322 mmol, Mn=6200, PDI=1.02, obtained from AZ-Electronic Materials, Branchburg, N.J.), TMC (0.246 g, 2.41 mmol) of from Example 4, and DCM (0.60 ml) were added. The reaction mixture was stirred until the AZ-PS-OH macroinitiator and TMC were completely dissolved in DCM, upon which DBU (about 12 mg, 0.078 mmol) was added. The reaction mixture was stirred at room temperature for 9.5 hours in a glove box. Aliquots of the reaction mixture were taken at regular intervals to determine the TMC ring opening by 1H NMR analysis and average molecular weight by GPC analysis. After 9.5 hours (570 minutes), the reaction was stopped by bringing the reaction vial out of the glove box and adding DCM (2 ml), acetyl chloride (0.1 g, 0.988 mmol), and TEA (0.1 g, 1.28 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. Mn (GPC)=19.3 k, Mw=20.5 k, PDI=1.06; Mn (NMR)=AZPS(6.2 k)-b-PTMC(7.2 k), n=57, m=71; TMC % conversion: ~99%.

Example 43. Fractionation of AZPS-b-PTMC Obtained from Example 42

AZPS-b-PTMC (0.2 g) from Example 42 was dissolved in THF to form a 20 wt % solution and the polymer was precipitated in methanol:acetonitrile (200 ml, 60:40 v:v). The precipitated solids and the solvents were collected in a centrifuge tube and the solids was collected by centrifuging at 4000 RPM at 0° C. followed by decanting the solvent and drying the solids in a vacuum oven at 40° C. for two hours. Mn (GPC)=19.3 k, Mw=20.5 k, PDI=1.06. Mn (NMR)= AZPS(6.2 k)-b-PTMC(6.8 k), n=57, m=67.

Table 9 summarizes the preparations and properties of the polystyrene-b-polycarbonate block copolymers before fractionation.

Table 10 summarizes the polystyrene-b-polycarbonate block copolymers after fractionation. A smaller change in Mn of the polycarbonate block ("Delta Mn (PC Block)") is desirable.

TABLE 9

| Example | Polymer Name | Monomer | Catalyst | Initiator | Temp | Time (hours) | GPC Mn (kDa) | GPC Mw (kDa) | PDI | NMR (Mn, kDa) PS block | NMR (Mn, kDa) PC block | Monomer % Conv. | Vf (PC block) |
|---|---|---|---|---|---|---|---|---|---|---|---|---|---|
| 11 | PS-PTMC | TMC-4 | DBU | PS—OH | rt | 2.5 | 13.1 | 14.3 | 1.09 | 5.5 | 4.8 | 86 | 0.41 |
| 12 | PS-PTMC | TMC-3 | DBU | PS—OH | rt | 4 | 13.5 | 15.6 | 1.15 | 6.5 | 4.5 | 98 | 0.35 |
| 13 | PS-PTMC | TMC-3 | DPP | PS—OH | rt | 15 | 17.9 | 20.1 | 1.12 | 9.4 | 11.5 | 94 | 0.49 |
| 14 | PS-PTMC | TMC-4 | DPP | PS—OH | rt | 20 | 11.9 | 12.9 | 1.07 | 5.5 | 5.4 | 99 | 0.44 |
| 15 | PS-PTMC | TMC-4 | DPP | PS—OH | rt | 20 | 16.1 | 17.5 | 1.08 | 5.5 | 6.3 | 99 | 0.47 |
| 16 | PS-PTMC | TMC-4 | DPP | PS—OH | rt | 20 | 18.5 | 20 | 1.08 | 5.5 | 7.7 | 99 | 0.52 |
| 17 | AZPS-PTMC | TMC-4 | DPP | AZ—PS—OH | rt | 16 | 13.3 | 13.7 | 1.029 | 6.2 | 7.7 | 99 | 0.49 |
| 18 | AZPS-PTMC | TMC-4 | DPP | AZ—PS—OH | rt | 16 | 14.1 | 14.5 | 1.029 | 6.2 | 7.7 | 99 | 0.49 |
| 19 | AZPS-PTMC | TMC-4 | DPP | AZ—PS—OH | rt | 12 | | | | | | | |
| 20 | AZPS-PTMC | TMC-4 | DPP | AZ—PS—OH | rt | 16 | 14.1 | 14.5 | 1.029 | 6.2 | 7.7 | 50 | 0.49 |
| 21 | AZPS-PTMC | TMC-4 | DPP | AZ—PS—OH | rt | 5 | 10.5 | 10.8 | 1.03 | 6.2 | 3.0 | 50 | 0.28 |
| 22 | AZPS-PTMC | TMC-4 | DPP | AZ—PS—OH | rt | 21 | 25 | 26 | 1.04 | 10.0 | 13.0 | 53 | 0.50 |
| 36 | AZPS-PMTC-Me | MTC-Me | DBU | AZ—PS—OH | rt | 1 | 15.5 | 16.8 | 1.08 | 6.2 | 5.9 | 99 | 0.43 |
| 42 | AZPS-PTMC | TMC-4 | DBU | AZ—PS—OH | rt | 9.5 | 19.3 | 20.5 | 1.06 | 6.2 | 7.2 | 99 | 0.48 |

Vf = volume fraction of the polycarbonate block of the block copolymer rt = room temperature PS block = polystyrene block PC block = polycarbonate block (PTMC or PMTC-Me)

TABLE 10

| Examples | Polymer Fractionated | Solvent | Solvent Volume Ratio | GPC Mn (kDa) | GPC Mw (kDa) | PDI | NMR analysis (Mn, kDa) PS block | NMR analysis (Mn, kDa) PC block | Delta Mn (PC Block) | Vf PC block |
|---|---|---|---|---|---|---|---|---|---|---|
| 23 | Ex. 12 | MeOH/ACN | 80/20 | 13.2 | 15.2 | 1.15 | 6.5 | 4.4 | 0.1 | 0.35 |
| 24 | Ex. 12 | MeOH/ACN | 60/40 | 13.2 | 15.2 | 1.15 | 6.5 | 4.0 | 0.5 | 0.33 |
| 25 | Ex. 12 | MeOH/ACN | 40/60 | 14.2 | 16.3 | 1.14 | 6.5 | 3.6 | 0.9 | 0.30 |
| 26 | Ex. 13 | MeOH/ACN | 40/60 | 18.5 | 20.0 | 1.08 | 9.4 | 4.4 | 7.1 | 0.27 |
| 28 | Ex. 14 | MeOH/ACN | 40/60 | 11.2 | 12.1 | 1.08 | 5.5 | 4.5 | 0.9 | 0.39 |
| 29 | Ex. 15 | MeOH/ACN | 40/60 | 14.8 | 16.1 | 1.08 | 5.5 | 5.3 | 1.0 | 0.43 |
| 30 | Ex. 16 | MeOH/ACN | 40/60 | 17.8 | 19.3 | 1.08 | 5.5 | 6.5 | 1.2 | 0.48 |
| 31 | Ex. 17 | MeOH/ACN | 60/40 | 13.5 | 13.9 | 1.02 | 6.2 | 5.8 | 1.9 | 0.42 |
| 32 | Ex. 18 | MeOH/ACN | 60/40 | 14.0 | 14.4 | 1.03 | 6.2 | 6.4 | 1.3 | 0.45 |
| 33 | Ex. 20 | MeOH/ACN | 60/40 | 17.2 | 17.6 | 1.02 | 6.2 | 7.7 | 0.0 | 0.49 |
| 34 | Ex. 21 | MeOH/ACN | 60/40 | 10.9 | 11.3 | 1.03 | 6.2 | 2.9 | 0.1 | 0.27 |
| 35 | Ex. 22 | MeOH/ACN | 60/40 | 22.1 | 24.2 | 1.09 | 10.0 | 13.3 | 0.3 | 0.51 |
| 37 | Ex. 36 | MeOH/ACN | 60/40 | 14.4 | 15.9 | 1.10 | 6.2 | 5.3 | 0.6 | 0.40 |
| 43 | Ex. 42 | MeOH/ACN | 60/40 | 19.3 | 20.5 | 1.06 | 6.2 | 6.8 | 0.3 | 0.46 |

Vf = volume fraction of polycarbonate block of the block copolymer
PC = polycarbonate block (PTMC or PMTC-Me)

The above examples demonstrate that fractionation of the product block polymer using a combination of a non-solvent for the polystyrene block and a nitrile solvent for the polycarbonate block in a 60:40 to 40:60 volume ratio, respectively, was effective in purifying the block polymer from polycarbonate homopolymer contaminants that can adversely affect the self-assembly properties of the block copolymer films. The highest level of polycarbonate homopolymer impurity was observed with ROPs having the highest cyclic carbonate monomer conversion (i.e., 95-99% conversion, Examples 25-32), as evidenced by the change in Mn of the polycarbonate (PC) block after fractionation (see column labeled "Delta Mn (PC block)" in Table 10). By comparison, ROPs that were stopped at 50-53% cyclic carbonate conversion (Examples 33-35 and 43) showed minimal amounts of polycarbonate homopolymer contaminant, as evidenced by the small change in Mn of the polycarbonate block after fractionation. Therefore, the homopolymer contaminant was formed predominantly in the later stages of the polymerization when cyclic carbonate monomer conversion was greater than about 70%. The following example utilized the above fractionation method to determine an optimum ROP reaction time for a given set of ROP conditions used to form the block polymer.

Example 44

The procedure of Example 18 was followed, scaling the reaction the same, and sampling the reaction mixture at various times during the ROP. A portion of each crude block polymer sample was analyzed for TMC content by NMR and for average molecular weight by GPC. Table 11 summarizes the TMC content of each sample and the Mn, Mw and PDI obtained by GPC before fractionation. Table 11 also includes the number average molecular weight (Mn) of the poly(trimethylene carbonate) (PTMC) block of the diblock polymer as determined by NMR based on the polystyrene (PS) block having an Mn of 6600.

TABLE 11

| Ex. 44 Sample | Time (minutes) | TMC % Conversion | GPC (Before Fractionation) Mn (kDa) | GPC (Before Fractionation) Mw (kDa) | PDI | NMR (Mn, kDA) PS | NMR (Mn, kDA) PTMC |
|---|---|---|---|---|---|---|---|
| 0 | 0 | 0.00 | 6.6 | 7.0 | 1.06 | 6.6 | 0.00 |
| 1 | 255 | 31.00 | 11.05 | 11.56 | 1.04 | 6.6 | |
| 2 | 410 | 46.50 | 13.43 | 14.04 | 1.04 | 6.6 | 3.66 |
| 3 | 480 | 54.75 | 14.26 | 14.93 | 1.04 | 6.6 | 4.40 |
| 4 | 560 | 62.00 | 15.10 | 15.82 | 1.04 | 6.6 | 5.00 |
| 5 | 635 | 68.30 | 15.53 | 16.35 | 1.04 | 6.6 | 5.57 |
| 6 | 755 | 76.50 | 16.84K | 17.64 | 1.04 | 6.6 | 6.26 |
| 7 | 875 | 82.70 | 17.79K | 18.60 | 1.04 | 6.6 | 6.77 |

Another portion of each Example 44 sample was precipitated in MeOH and fractionated using a mixture of MeOH and acetonitrile (60/40 by volume, respectively) according to the above-described procedure. Table 12 summarizes the Mn, Mw and PDI of each sample after fractionation obtained by GPC. Table 12 also includes the number average molecular weight (Mn) of the PTMC block after fractionation obtained by NMR based on the PS block having an Mn of 6600. Table 12 also lists the change in Mn of the PTMC block relative to the pre-fractionated sample.

TABLE 12

| Ex. 44 Sample | Time (minutes) | TMC % Conversion | GPC (After Fractionation) Mn (kDa) | GPC (After Fractionation) Mw (kDa) | PDI | NMR (Mn, kDA) PS | NMR (Mn, kDA) PTMC | Delta Mn PTMC Block (kDa) |
|---|---|---|---|---|---|---|---|---|
| 0 | 0 | 0.00 | | | | | | |
| 1 | 255 | 31.00 | | | | | | |
| 2 | 410 | 46.50 | 13.0 | 13.6 | 1.04 | 6.6 | 3.61 | 0.05 |
| 3 | 480 | 54.75 | 14.1 | 14.8 | 1.04 | 6.6 | 4.23 | 0.17 |
| 4 | 560 | 62.00 | 14.84 | 15.53 | 1.04 | 6.6 | 4.84 | 0.16 |
| 5 | 635 | 68.30 | 15.67 | 16.4 | 1.04 | 6.6 | 5.39 | 0.18 |
| 6 | 755 | 76.50 | 17.1 | 17.85 | 1.04 | 6.6 | 6.04 | 0.22 |
| 7 | 875 | 82.70 | 17.9 | 18.57 | 1.04 | 6.6 | 6.40 | 0.37 |

The results indicate that samples 6 and 7 have significantly higher levels of PTMC homopolymer, indicated by the increase in delta Mn from 0.18 of sample 5 to 0.37 for sample 7.

Using the above data from Example 44, an optimum reaction time was determined using the following procedure.

Method 2

For a given set of reaction conditions (Example 44), the % TMC conversion was plotted as a function of reaction time in minutes, and a second order polynomial trendline F(t) was fitted to the data. F(t) is shown in FIG. 1 (graph). In this instance, $F(t)=-0.00005t^2+0.1352t$, having $R^2=0.9993$.

Using F(t) and the quadratic equation, the reaction duration time $t_1$ at 50% TMC conversion ($F(t_1)=50$) was calculated from the expression $50=-0.00005t_1^2+0.1352t_1$. In this instance, $t_1=442$ minutes.

The first derivative of F(t) has the expression $F'(t)=-0.0001t+0.1352$ (a line). Table 13 lists the value of F'(t) at each measurement time t. FIG. 2 is graph of F'(t) at as a function of t, showing the linear relationship.

TABLE 13

| Ex. 44 Samples | Time (minutes) | TMC % Conversion | F'(t) | NMR (Mn, kDA) PS | NMR (Mn, kDA) PTMC | Delta Mn PTMC Block (kDa) |
|---|---|---|---|---|---|---|
| 0 | 0 | 0.00 | 0.1352 | | | |
| 1 | 255 | 31.00 | 0.1097 | | | |
| 2 | 410 | 46.50 | 0.0942 | 6.6 | 3.61 | 0.05 |
| 3 | 480 | 54.75 | 0.0872 | 6.6 | 4.23 | 0.17 |
| 4 | 560 | 62.00 | 0.0792 | 6.6 | 4.84 | 0.16 |
| 5 | 635 | 68.30 | 0.0717 | 6.6 | 5.39 | 0.18 |
| 6 | 755 | 76.50 | 0.0597 | 6.6 | 6.04 | 0.22 |
| 7 | 875 | 82.70 | 0.0477 | 6.6 | 6.40 | 0.37 |

The value of F'(t) at $t_1$ (50% cyclic carbonate conversion) was calculated as $F'(442)=-0.0001(442)+0.1352=0.091$.

The duration time corresponding to a 10% drop in F'(442) was calculated, which is $0.9(0.091)=0.0819$. This value of F'(t) corresponds to a duration time of 533 minutes.

The duration time corresponding to a 20% drop in F'(442) was calculated, which is $0.8(0.091)=0.0728$. This value of F'(t) corresponds to a reaction time of 624 minutes.

The ROP can be conducted using a reaction time of about 422 minutes ($t_1$) to about 624 minutes ($t_3$), more particularly about 533 minutes ($t_2$) to about 624 minutes ($t_3$) for the given reaction conditions. A ROP reaction time in this range provides for the most efficient incorporation of the cyclic carbonate monomer into the block polymer and the lowest level of polycarbonate homopolymer impurity in the isolated block polymer.

Alternatively, the duration time of the ROP was determined by the following method.

F'(t) was obtained as described above. The change in F'(t), ΔF'(t), was then calculated between adjacent measurement times, where $\Delta F'(t_n)=F'(t_n)-F'(t_{n-1})$ for adjacent times $t_n$ and $t_{n-1}$, wherein $t_n>0$. Table 14 below lists the calculated values for ΔF'(t) for each measurement time t.

TABLE 14

| Ex. 44 Samples | Time (minutes) | TMC (% Conversion) | F'(t) | ΔF'(t) | NMR (Mn, kDA) PS | NMR (Mn, kDA) PTMC | Mn PTMC Block (kDa) |
|---|---|---|---|---|---|---|---|
| 0 | 0 | 0.00 | 0.1352 | | | | |
| 1 | 255 | 31.00 | 0.1097 | −0.0255 | | | |
| 2 | 410 | 46.50 | 0.0942 | −0.0155 | 6.6 | 3.61 | 0.05 |
| 3 | 480 | 54.75 | 0.0872 | −0.0070 | 6.6 | 4.23 | 0.17 |
| 4 | 560 | 62.00 | 0.0792 | −0.0080 | 6.6 | 4.84 | 0.16 |
| 5 | 635 | 68.30 | 0.0717 | −0.0075 | 6.6 | 5.39 | 0.18 |
| 6 | 755 | 76.50 | 0.0597 | −0.0120 | 6.6 | 6.04 | 0.22 |
| 7 | 875 | 82.70 | 0.0477 | −0.0120 | 6.6 | 6.40 | 0.37 |

A scatter plot of ΔF'(t) versus t was made, and a second order polynomial $D(t)=-0.0000001t^2+0.0002t-0.0562$ fitted to the data points (FIG. 3). D(t) has a first derivative that approaches zero at about 630 minutes (t"=630 minutes). The ROP duration time for the given conditions can then be set to 0.8t" to t", or in this instance about 504 minutes to about 630 minutes.

Stopping the ROP at the calculated end point favors an isolated block polymer having sufficient purity to be used without fractionating the polymer further. If desired, the isolated block copolymer can be further purified by precipitation in a solvent mixture comprising i) a non-solvent for the block derived from the vinyl polymerizable monomer and ii) a nitrile solvent, wherein the volume ratio of the non-solvent to nitrile solvent is 40:60 to 60:40.

Example 45

Figure 20:
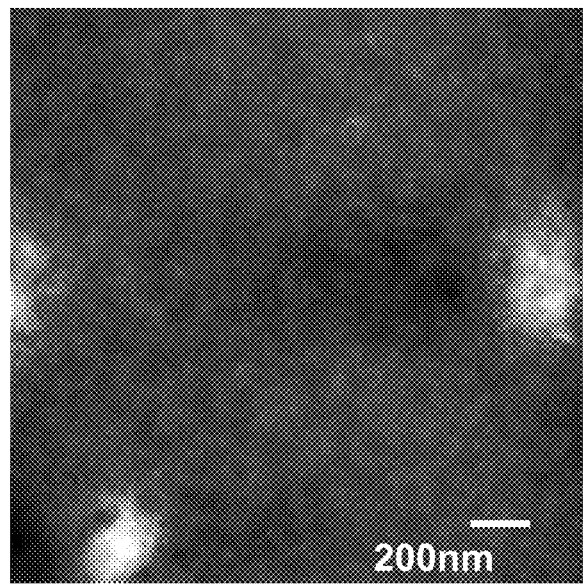
FIG. 20 is an AFM image of the as-cast film of Example 45 formed with the block polymer of Example 17.

Using the general procedure of Example 40, a thin film of the block polymer prepared in Example 17 was formed. FIG. 20 is an AFM image of the as-cast film. The as-cast film shows slight topography in a few areas indicated by white patches in the AFM height image, but smooth otherwise. These white patches depict elevated areas as compared to rest of the film. The AFM image of the as-cast film shows partial self-assembly of the block polymer.

Example 46

Figure 21:
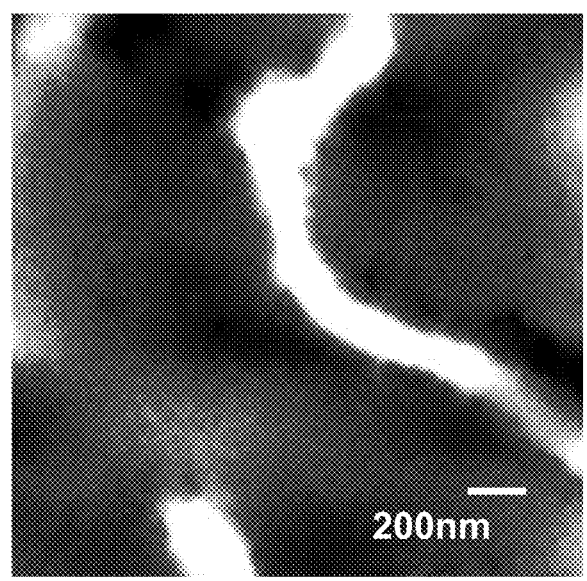
FIG. 21 is an AFM image of the as-cast film of Example 46 formed with the block polymer of Example 20.

Using the general procedure of Example 40, a thin film of the block polymer prepared in Example 20 was formed. FIG. 21 is an AFM image of the as-cast film. The as cast film is not smooth and shows considerable topography. The white area indicates elevated features in the AFM height image. The film does not show evidence of self-assembly of the block polymer.

Example 47

Figure 22:
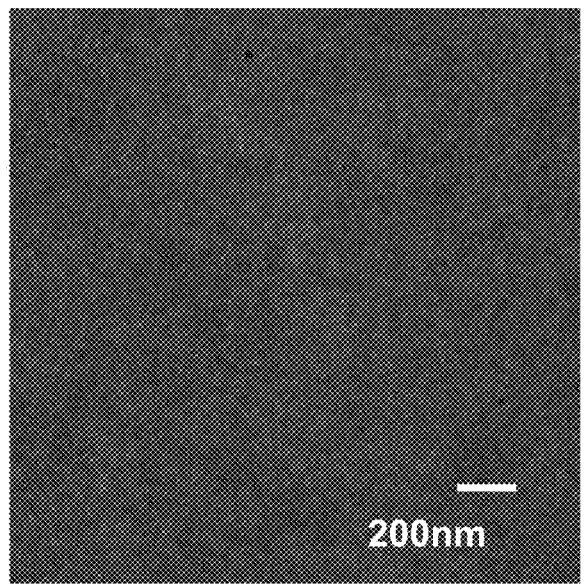
FIG. 22 is an AFM image of the as-cast film of Example 47 formed with the block polymer of Example 21.

Using the general procedure of Example 40, a thin film of the block polymer prepared in Example 21 was formed. FIG. 22 is an AFM image of the as-cast film. The AFM image of the as-cast film shows partial self-assembly of the block polymer.

Example 48

Figure 23:
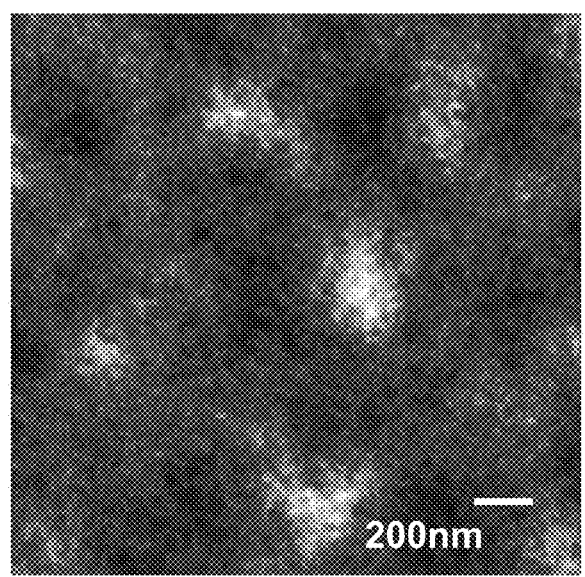
FIG. 23 is an AFM image of the as-cast film of Example 48 formed with the block polymer of Example 31.

Using the general procedure of Example 40, a thin film of the block polymer prepared in Example 31 was formed. FIG. 23 is an AFM image of the as-cast film. The as cast film shows slight topography in a few areas indicated by white and red patches in AFM height image, but smooth otherwise.

The white patches depict elevated areas, and darker (red) indicates suppressed areas compared to rest of the film. The AFM image of the as-cast film shows partial self-assembly of the block polymer.

Example 49

Figure 24:
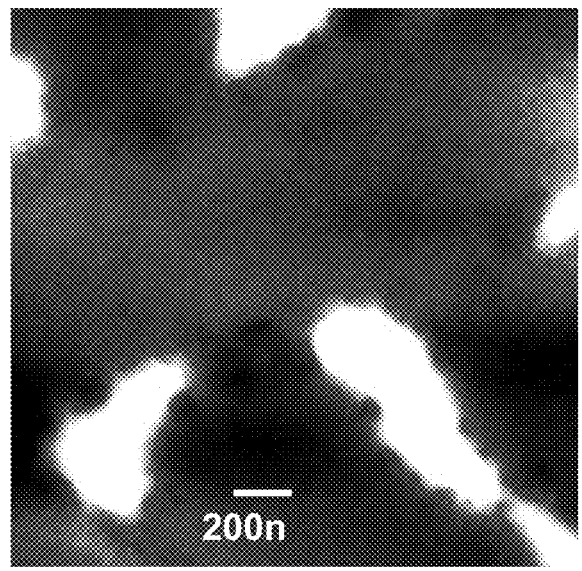
FIG. 24 is an AFM image of the as-cast film of Example 49 formed with the block polymer of Example 33.

Using the general procedure of Example 40, a thin film of the block polymer prepared in Example 33 was formed. FIG. 24 is an AFM image of the as-cast film. The as-cast film is not smooth and shows considerable topography. The white area indicates elevated feature in AFM height image. The AFM image of the as-cast film does not show evidence of partial self-assembly of the block polymer.

Example 50

Figure 25:
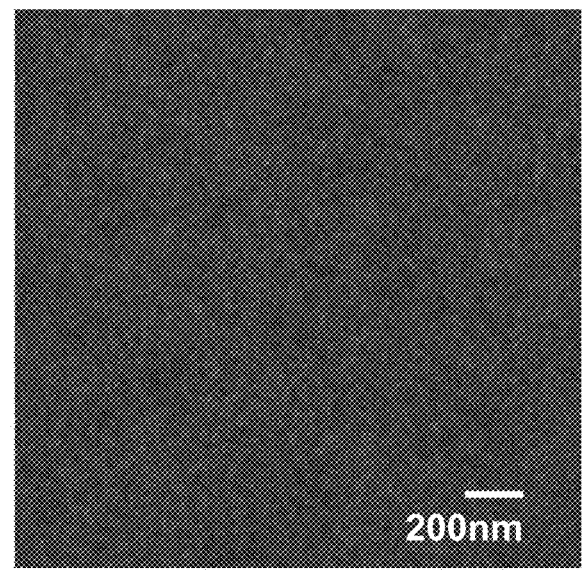
FIG. 25 is an AFM image of the as-cast film of Example 50 formed with the block polymer of Example 34.

Using the general procedure of Example 40, a thin film of the block polymer prepared in Example 34 was formed. FIG. 25 is an AFM image of the as-cast film. The AFM image of the as-cast film shows partial self-assembly of the block polymer.

Example 51

Figure 26:
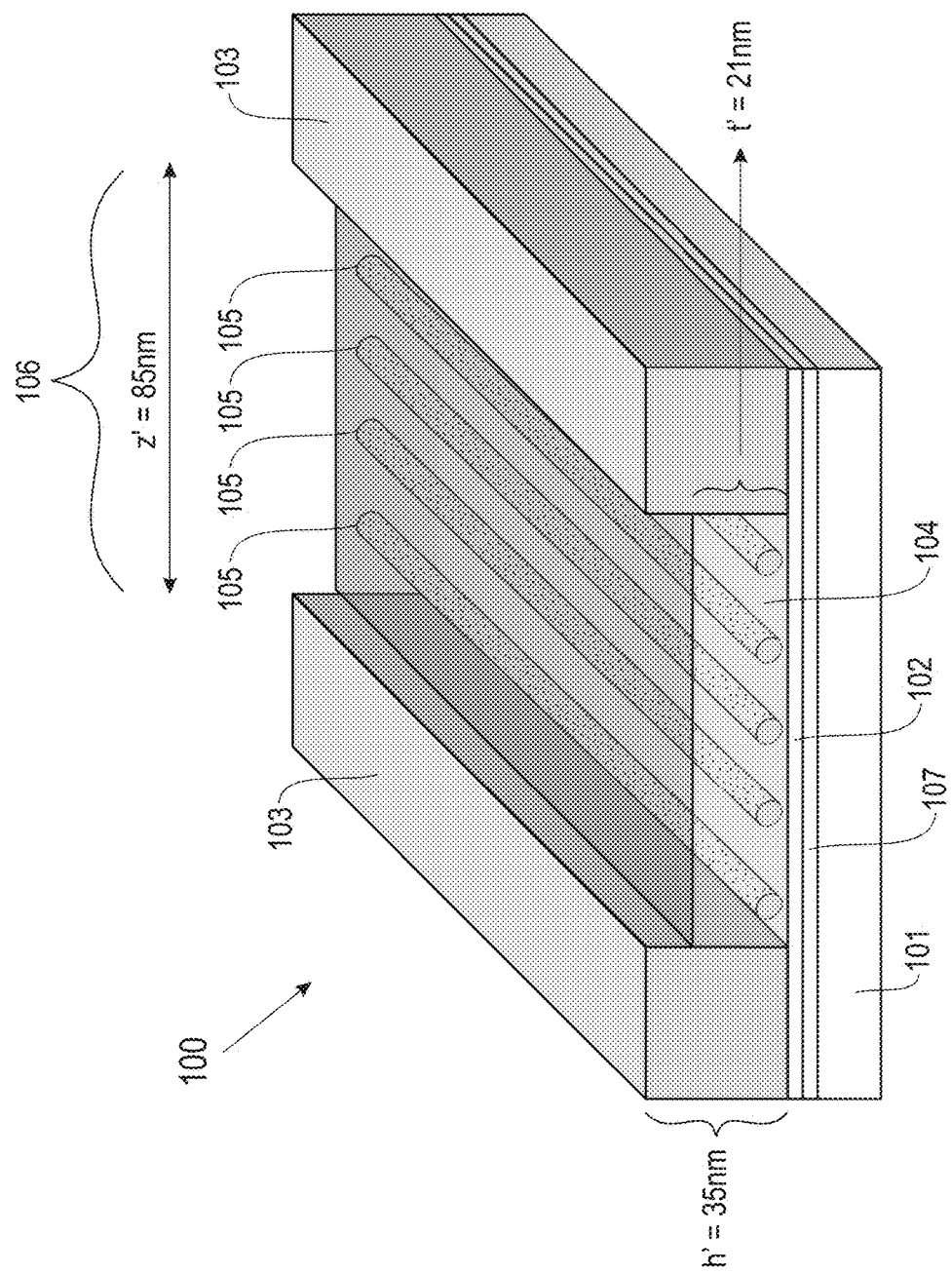
FIG. 26 is a layer diagram depicting the coated structure of Example 51 containing the self-assembled block polymer.
Figure 27:
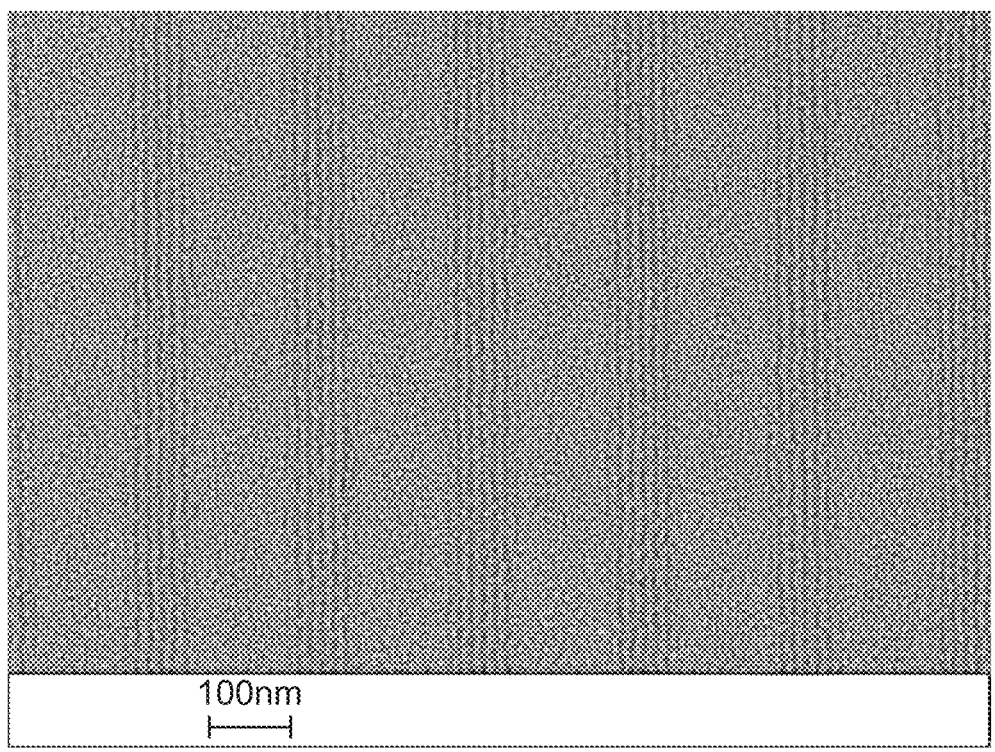
FIG. 27 is an SEM image of the structure of Example 51 after etching.
Figure 28:
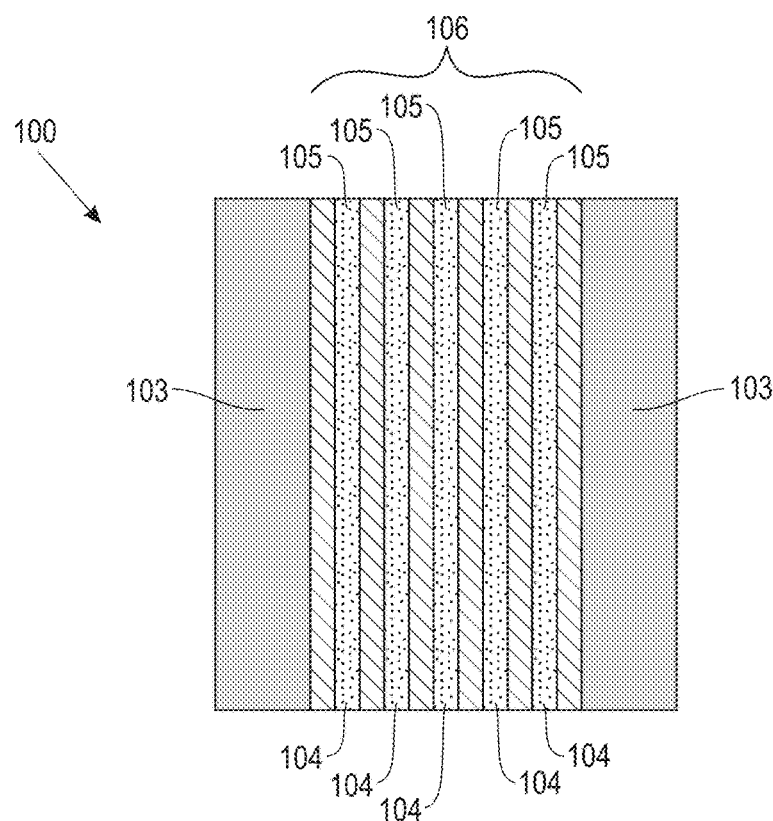
FIG. 28 is a top down view of a diagram of the structure of Example 51 before etching.
Figure 29:
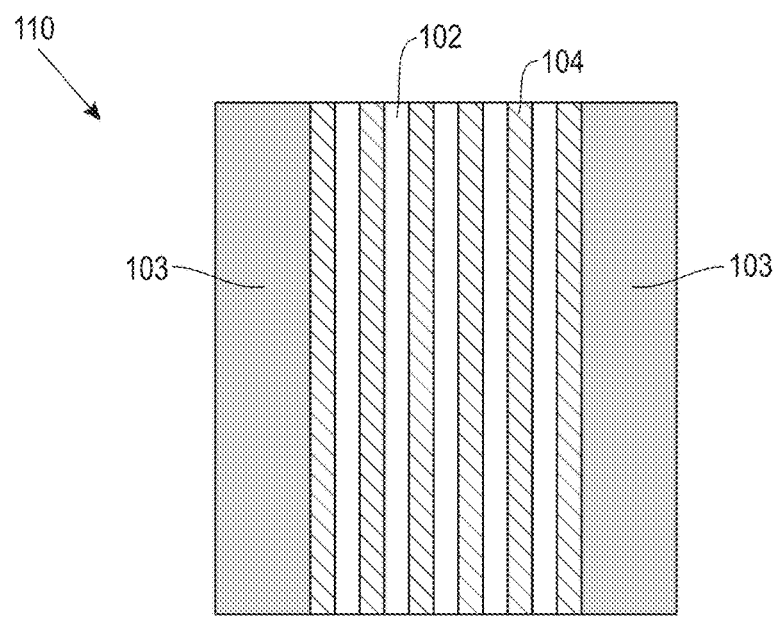
FIG. 29 is a top down view of a diagram of the structure of Example 51 after etching.

Directed self-assembly of fractionated PS-b-PTMC of Example 34. A topographical pre-pattern to direct the self-assembly of fractionated PS-b-PTMC of Example 34 was prepared by exposing a 193i photoresist (JSR AIM7210) film coated on a underlayer-coated substrate using 193 nm interference lithography. The substrate was a silicon wafer coated with a 193 nm anti-reflective ARC29A (Brewer Science) layer. The underlayer described in Example 39 was coated on the anti-reflective layer using the general procedure of Example 39. The non-exposed area of the photoresist was developed in a negative tone using an organic solvent (2-heptanone) developer, resulting in a regular grating pattern having a 100 nm half-pitch. This pre-pattern was baked at 200° C. for 3 minutes to make the pre-pattern insoluble to organic solvent. A solution of fractionated PS-b-PTMC of Example 34 that was dissolved in PGMEA (1% w/w) was then spin-coated on the pre-pattern at 4000 rpm to form a thin film allocated substantially in the trenches of the pre-pattern. The block copolymer coated pre-pattern sample was then baked at 170° C. for 5 minutes and cooled down to room temperature to let the PS-b-PTMC self-assemble alongside the sidewall of the pre-pattern trenches, as illustrated in layered structure 100 of FIG. 26 (cross-sectional diagram). Layered structure 100 shows silicon wafer 101, anti-reflective layer 107, underlayer 102, resist topographical features 103 having a height h' of 35 nm, trench area 106 having a width z' of 85 nm between features 103, self-assembled block polymer layer having a thickness t' of 21 nm, and phase domains 104 and 105 of the self-assembled block polymer located in the trench area 106. Domain 104 represents the PS phase. Parallel cylinder domains 105 represent the PTMC phase. Parallel cylinder domains 105 are embedded in the PS domain 104. The sample was subjected to a brief RIE etch utilizing a combination of $CF_4$ and $H_2$ gases to etch the top layer of PS and slightly etch the PTMC domains and enhance the contrast between PS and PTMC domains during SEM characterization. The SEM characterization revealed well-aligned PS-b-PTMC of Example 34 in the trenches of the pre-pattern. The top down SEM image of FIG. 27 shows that in the 85 nm-wide trenches, 5 PTMC cylinders aligned parallel to the sidewall revealing 6 aligned PS lines after etching. From the cross-sectional SEM image, a monolayer of PS-b-PTMC cylinder block copolymer with a thickness of approximately 21 nm was shown to occupy the 35 nm-high trenches. FIG. 28 is a diagram showing a top down view of layered structure 100 before etch. FIG. 29 is a diagram showing a top down view of layered structure 110, which is layered structure 100 after the etch. Layered structure 110 shows the PS domains 104 remaining in the trench area 106 after selective removal of PTMC domains 105. PS domains 104 appear as lines parallel to resist features 103. In this instance, the etch exposes anti-reflective layer 102.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:
1. A method, comprising:
i) providing a mathematical function F(t) for a ring opening polymerization (ROP) of a cyclic carbonyl monomer, wherein
F(t) expresses an amount of consumed cyclic carbonyl monomer as a function of ROP duration time t for a given set of reaction conditions,
the ROP utilizes a reaction mixture initially comprising the cyclic carbonyl monomer, a polymeric initiator for the ROP, a ROP catalyst, and a solvent,
the polymeric initiator comprises i) a polymer backbone comprising repeating functionalized ethylene units and ii) 1 to 2 nucleophilic groups linked to respective end groups of the polymer backbone, the nucleophilic groups capable of initiating the ROP of the cyclic carbonyl monomer,
F(t) has a duration time $t_1>0$ corresponding to 50% consumption of the cyclic carbonyl monomer,
F(t) has duration times $t_2$ and $t_3$ wherein $t_3>t_2>t_1$,
F(t) has a first derivative designated F'(t),
F'(t) at $t_1$ has a value $F'(t_1)=m$, wherein m is a number $>0$
F'(t) at $t_2$ has a value $F'(t_2)=0.9m$, and
F'(t) at $t_3$ has a value $F'(t_3)=0.8m$;
ii) conducting the ROP of the cyclic carbonyl monomer using the given set of reaction conditions; and
iii) stopping the ROP at a ROP duration time of about $t_1$ to about $t_3$, thereby forming a second mixture comprising a block polymer, wherein the block polymer comprises a first block linked to a second block, the first block comprises the polymer backbone comprising repeating functionalized ethylene units, the second block comprises a backbone derived from ROP of the cyclic carbonyl monomer, the first block is substantially immiscible with the second block, the second mixture is free of, or substantially free of, any polymer having a chemical structure that contains none of the polymer backbone of the polymeric initiator, and the block copolymer is capable of self-assembly to form a phase separated domain pattern comprising alternating domains of the first block and the second block.

2. The method of claim 1, wherein said stopping the ROP comprises treating a living end group of the second block with an alcohol protecting agent.

3. The method of claim 2, wherein the alcohol protecting agent is a compound selected from the group consisting of active esters, acid halides, acid anhydrides, isocyanates, ether forming agents, perfluorinated derivatives of any of the foregoing compounds, and combinations thereof.

4. The method of claim 1, wherein said stopping the ROP comprises precipitating the block polymer in a solvent mixture, the solvent mixture comprising i) a first solvent that is a non-solvent for the first block and a non-solvent for the second block and ii) a second solvent comprising a nitrile group, the second solvent a non-solvent for the first block and a solvent for the second block, wherein the first solvent: second solvent volume ratio is about 40:60 to about 60:40.

5. The method of claim 4, wherein the first solvent is an alcohol.

6. The method of claim 4, wherein the second solvent is acetonitrile.

7. The method of claim 1, wherein the ROP is performed at ambient temperature.

8. The method of claim 1, wherein the polymeric initiator is a polystyrene comprising one hydroxy end group.

9. The method of claim 1, wherein the block polymer is capable of self-assembly to form cylindrical domains of the second block in a matrix of the first block.

10. The method of claim 1, wherein the block polymer is capable of self-assembly to form spherical domains of the second block in a matrix of the first block.

11. The method of claim 1, wherein the block polymer is capable of self-assembly to form lamellar structures comprising alternating domains of the first block and the second block.

12. The method of claim 1, wherein the ROP catalyst is a phosphate diester.

13. The method of claim 1, wherein the ROP catalyst is diphenylphosphate (DPP).

14. The method of claim 1, wherein the cyclic carbonyl monomer is a cyclic ester.

15. The method of claim 1, wherein the cyclic carbonyl monomer is lactide.

16. The method of claim 15, wherein the cyclic carbonyl monomer is a cyclic carbonate.

17. The method of claim 16, wherein the cyclic carbonyl monomer is trimethylene carbonate:

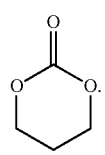

18. The method of claim 16, wherein the cyclic carbonyl monomer is MTC-Me:

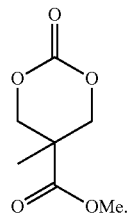

19. The method of claim 1, wherein no cyclic carbonyl monomer is added to the reaction mixture after the ROP is initiated.

20. A method, comprising:
i) providing a mathematical function F(t) for a ring opening polymerization (ROP) of a cyclic carbonyl monomer, wherein
    F(t) expresses an amount of consumed cyclic carbonyl monomer as a function of ROP duration time t for a given set of reaction conditions,
    the ROP utilizes a reaction mixture initially comprising the cyclic carbonyl monomer, a polymeric initiator for the ROP, a ROP catalyst, and a solvent,
    the polymeric initiator comprises i) a polymer backbone comprising repeating functionalized ethylene units and ii) 1 to 2 nucleophilic groups linked to respective end groups of the polymer backbone, the nucleophilic groups capable of initiating the ROP of the cyclic carbonyl monomer, and
    F(t) has a first derivative F'(t);
ii) providing a mathematical function D(t) expressing change in F'(t) between adjacent ROP duration times, designated $\Delta F'(t)$, as a function of ROP duration time t, wherein i) $\Delta F'(t_n)=F'(t_n)-F'(t_{n-1})$ for adjacent duration times $t_n$ and $t_{n-1}$, $t_n>t_{n-1}$, and n is a positive integer greater than or equal to 1, ii) D(t) has a first derivative designated D'(t), and iii) D'(t) has a duration time t'>0 wherein D'(t')=0;
iii) conducting the ROP of the cyclic carbonyl monomer using the given set of reaction conditions; and
iv) stopping the ROP at a polymerization duration time of 0.8t' to t', thereby forming a second mixture comprising a block polymer capable of self-assembly, wherein the block polymer comprises a first block comprising the polymer backbone comprising repeating functionalized ethylene units, the first block being linked by a polymer chain end group to a second block comprising a polymer backbone derived from the cyclic carbonyl monomer, the first block is substantially immiscible with the second block, the second mixture is substantially free of any polymer having a chemical structure that contains none of the polymer backbone of the polymeric initiator, and the block copolymer is capable of self-assembly to form a phase separated domain pattern comprising alternating domains of the first block and the second block.

21. The method of claim 20, wherein the D(t) is a polynomial expression having an R-squared value of about 0.85 to 1.0.

* * * * *